United States Patent
Lee et al.

(10) Patent No.: US 11,664,310 B2
(45) Date of Patent: May 30, 2023

(54) SEMICONDUCTOR DEVICE AND METHOD OF FABRICATING THE SAME

(71) Applicant: Samsung Electronics Co., Ltd., Suwon-si (KR)

(72) Inventors: Eui Bok Lee, Seoul (KR); Donggon Yoo, Incheon (KR); Wandon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 142 days.

(21) Appl. No.: 17/373,573

(22) Filed: Jul. 12, 2021

(65) Prior Publication Data

US 2022/0199522 A1   Jun. 23, 2022

(30) Foreign Application Priority Data

Dec. 17, 2020 (KR) .................. 10-2020-0177705

(51) Int. Cl.
| | |
|---|---|
| H01L 23/522 | (2006.01) |
| H01L 29/06 | (2006.01) |
| H01L 29/08 | (2006.01) |
| H01L 23/528 | (2006.01) |

(52) U.S. Cl.
CPC ...... *H01L 23/5226* (2013.01); *H01L 23/5283* (2013.01); *H01L 29/0649* (2013.01); *H01L 29/0847* (2013.01)

(58) Field of Classification Search
CPC ............. H01L 23/5226; H01L 23/5283; H01L 23/485; H01L 23/5221; H01L 23/53295; H01L 29/0649; H01L 29/0673; H01L 21/76895; H01L 21/76832; H01L 21/823871
USPC ........................................................ 257/288
See application file for complete search history.

(56) References Cited

U.S. PATENT DOCUMENTS

| | | | | |
|---|---|---|---|---|
| 5,937,324 | A  * | 8/1999 | Abercrombie | .... H01L 23/53223 |
| | | | | 257/E23.152 |
| 8,618,607 | B1 | 12/2013 | Rashed et al. | |
| 8,866,116 | B2 * | 10/2014 | Eungyoon | ............. G11C 11/161 |
| | | | | 438/666 |
| 10,366,950 | B2 | 7/2019 | Lin et al. | |
| 10,607,922 | B1 | 3/2020 | Mignot et al. | |
| 10,685,833 | B2 | 6/2020 | Krishtab et al. | |
| 10,734,278 | B2 | 8/2020 | Aizawa et al. | |
| 2010/0102455 | A1 * | 4/2010 | Yokoi | ................. H01L 21/7682 |
| | | | | 257/E23.141 |
| 2013/0161722 | A1 * | 6/2013 | Son | ................... H01L 29/66545 |
| | | | | 257/379 |

(Continued)

*Primary Examiner* — Dao H Nguyen
(74) *Attorney, Agent, or Firm* — Harness, Dickey & Pierce, P.L.C.

(57) ABSTRACT

A semiconductor device including transistors on a substrate, a first interlayer insulating layer on the transistors, a first lower interconnection line and a second lower interconnection line in an upper portion of the first interlayer insulating layer, a dielectric layer being selectively on a top surface of the first interlayer insulating layer except top surfaces of the first and second lower interconnection lines, an etch stop layer on the first and second lower interconnection lines and the dielectric layer, a second interlayer insulating layer on the etch stop layer, and an upper interconnection line in the second interlayer insulating layer may be provided.

20 Claims, 33 Drawing Sheets

(56) References Cited

U.S. PATENT DOCUMENTS

| | | | |
|---|---|---|---|
| 2013/0256778 A1* | 10/2013 | Sim | H01L 29/40114 |
| | | | 257/421 |
| 2014/0239363 A1* | 8/2014 | Pan | H01L 23/485 |
| | | | 257/306 |
| 2017/0170229 A1* | 6/2017 | Oh | H01L 27/14636 |
| 2019/0318989 A1 | 10/2019 | Shao et al. | |
| 2020/0098688 A1 | 3/2020 | Shi et al. | |

* cited by examiner

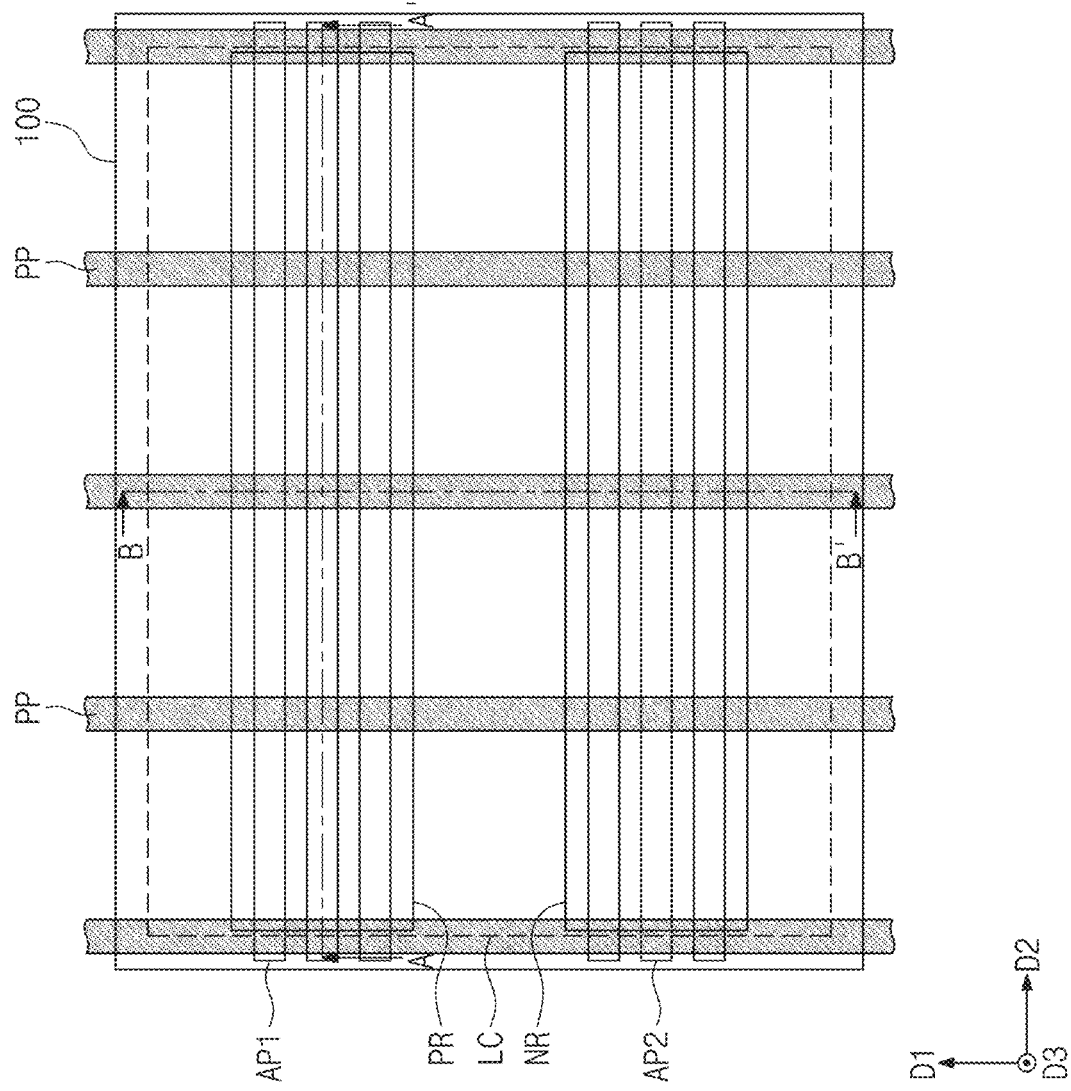

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2020-0177705, filed on Dec. 17, 2020, in the Korean Intellectual Property Office, the entire contents of which are hereby incorporated by reference.

BACKGROUND

The present disclosure relates to semiconductor devices and/or methods of fabricating the same, and in particular, to semiconductor devices including a field effect transistor and/or methods of fabricating the same.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize semiconductor devices with high performance.

SUMMARY

Some example embodiments of the inventive concepts provide semiconductor devices with improved reliability and electrical characteristics, and/or methods of fabricating the same.

According to an example embodiment of the inventive concepts, a semiconductor device may include transistors on a substrate, a first interlayer insulating layer on the transistors, a first lower interconnection line and a second lower interconnection line in an upper portion of the first interlayer insulating layer, a dielectric layer being selectively on a top surface of the first interlayer insulating layer except top surfaces of the first and second lower interconnection lines, an etch stop layer on the first and second lower interconnection lines and the dielectric layer, a second interlayer insulating layer on the etch stop layer, and an upper interconnection line in the second interlayer insulating layer. The upper interconnection line may include a line portion and a bar via extending from the line portion to the first and second lower interconnection lines to penetrate the etch stop layer. The bar via may include a first contact portion and a second contact portion connected to the first and second lower interconnection lines, respectively, and a first connecting portion between the first and second contact portions. A bottom surface of the first connecting portion may be higher than the top surface of the first interlayer insulating layer and may be lower than a top surface of the etch stop layer, due to the dielectric layer.

According to an example embodiment of the inventive concepts, a semiconductor device may include transistors on a substrate, a first interlayer insulating layer on the transistors, a first lower interconnection line and a second lower interconnection line in an upper portion of the first interlayer insulating layer, a dielectric layer being selectively on a top surface of the first interlayer insulating layer except top surfaces of the first and second lower interconnection lines, an etch stop layer on the first and second lower interconnection lines and the dielectric layer, a second interlayer insulating layer on the etch stop layer, and a first upper interconnection line in the second interlayer insulating layer. The first upper interconnection line may include a first line portion and a bar via extending from the first line portion to the first and second lower interconnection lines to penetrate the etch stop layer. The bar via may include a first contact portion and a second contact portion connected to the first and second lower interconnection lines, respectively, and a first connecting portion between the first and second contact portions. A top surface of the dielectric layer between the first and second contact portions may be covered with the first connecting portion. A thickness of the dielectric layer between the first and second contact portions may increase until the thickness reaches a maximum value and then may decrease, along a direction from the first contact portion to the second contact portion.

According to an example embodiment of the inventive concepts, a semiconductor device may include a substrate including an active region, a device isolation layer defining active patterns on the active region, the device isolation layer covering a lower side surface of each of the active patterns, an upper portion of each of the active patterns protruding above the device isolation layer, a pair of source/drain patterns at the upper portion of each of the active patterns, a channel pattern between the pair of source/drain patterns, a gate electrode extending in a first direction to cross the channel pattern, a gate spacer on opposite side surfaces of the gate electrode and extending along the gate electrode in the first direction, a gate insulating layer between the gate electrode and the channel pattern and between the gate electrode and the gate spacer, a gate capping pattern on a top surface of the gate electrode and extending along the gate electrode and in the first direction, a first interlayer insulating layer on the gate capping pattern, an active contact penetrating the first interlayer insulating layer and electrically connected to at least one of the source/drain patterns, a first metal layer in a second interlayer insulating layer, the second interlayer insulating layer being on the first interlayer insulating layer, a second metal layer in a third interlayer insulating layer, the third interlayer insulating layer being on the second interlayer insulating layer, and a dielectric layer and an etch stop layer between the second interlayer insulating layer and the third interlayer insulating layer. The etch stop layer may cover the dielectric layer, the first metal layer may include a first lower interconnection line and a second lower interconnection line, and the second metal layer may include a first upper interconnection line electrically connected to the first and second lower interconnection lines. The first upper interconnection line may include a first line portion and a bar via extending from the first line portion to the first and second lower interconnection lines to penetrate the etch stop layer. The bar via may include a first contact portion and a second contact portion connected to the first and second lower interconnection lines, respectively, and a first connecting portion between the first and second contact portions. A bottom surface of the first connecting portion may be higher than a top surface of the second interlayer insulating layer and may be lower than a top surface of the etch stop layer, due to the dielectric layer.

According to an example embodiment of the inventive concepts, a method of fabricating a semiconductor device may include forming transistors on a substrate, forming a first interlayer insulating layer on the transistors, forming a first lower interconnection line and a second lower interconnection line in an upper portion of the first interlayer insulating layer, selectively forming a dielectric layer on a top surface of the first interlayer insulating layer except top surfaces of the first and second lower interconnection lines, forming an etch stop layer on the first and second lower interconnection lines and the dielectric layer, forming a second interlayer insulating layer on the etch stop layer, patterning the second interlayer insulating layer to form an upper interconnection hole, and forming an upper interconnection line to fill the upper interconnection hole. The upper interconnection hole may include a first contact hole and a second contact hole, which are formed to penetrate the etch stop layer and to expose the top surfaces of the first and second lower interconnection lines, respectively, and the dielectric layer between the first and second contact holes may be exposed through the upper interconnection hole.

BRIEF DESCRIPTION OF THE DRAWINGS

FIGS. 5, 7, 9, and 11 are plan views illustrating a method of fabricating a semiconductor device according to an example embodiment of the inventive concepts.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
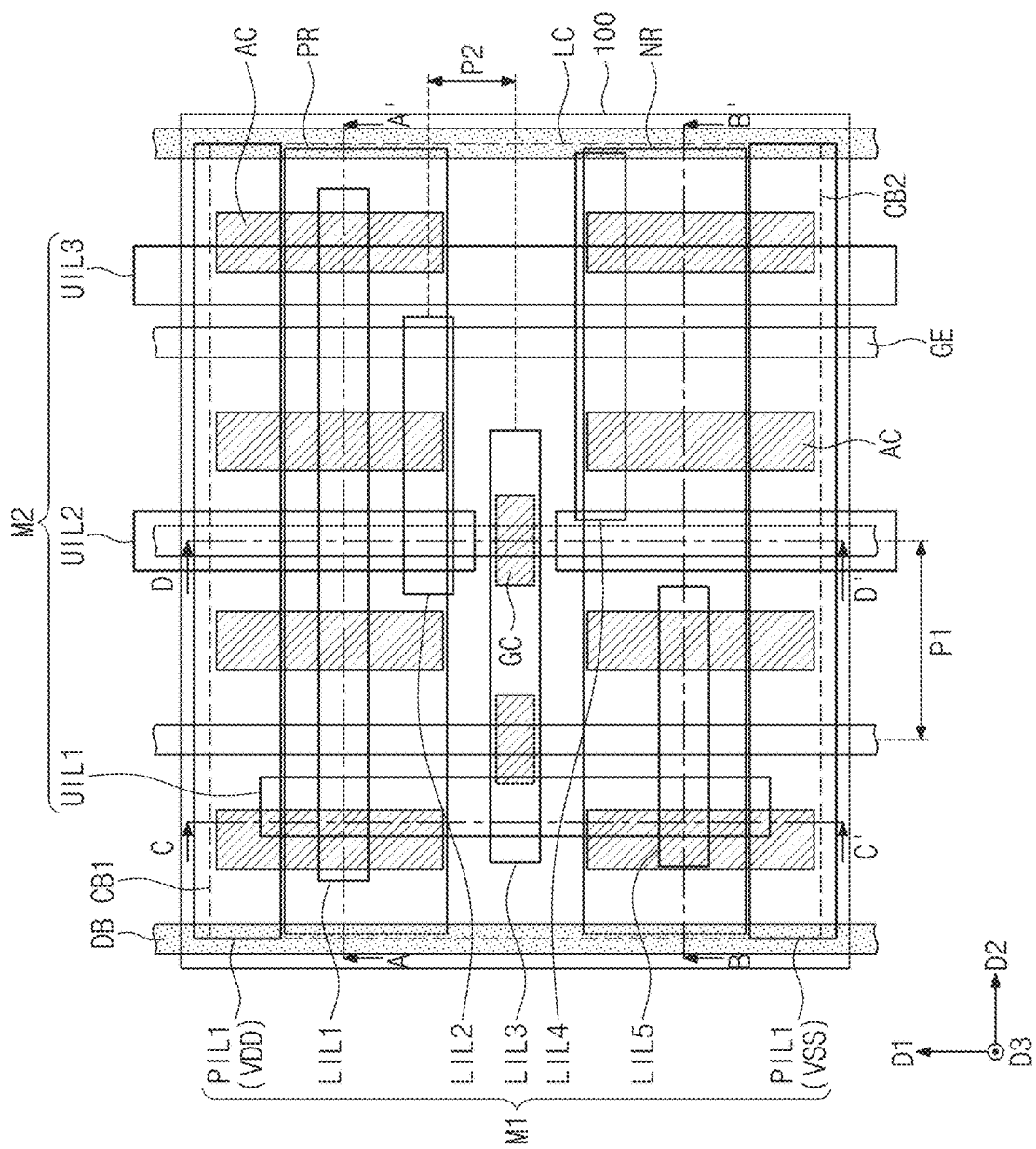
FIG. 1 is a plan view illustrating a semiconductor device according to an example embodiment of the inventive concepts.

FIG. 1 is a plan view illustrating a semiconductor device according to an example embodiment of the inventive concepts. FIGS. 2A to 2D are sectional views taken along lines A-A', B-B', C-C', and D-D' of FIG. 1, respectively. FIG. 3 is an enlarged sectional view of a portion M of FIG. 2D.

Referring to FIGS. 1 and 2A to 2D, a logic cell LC may be provided on a substrate 100. In the present specification, the logic cell LC may mean a logic device (e.g., an inverter, a flip-flop, and so forth), which is configured to execute a specific function. For example, the logic cell LC may include transistors constituting the logic device and interconnection lines connecting the transistors to each other.

The substrate 100 may include a first active region PR and a second active region NR. In an example embodiment, the first active region PR may be a PMOSFET region, and the second active region NR may be an NMOSFET region. The substrate 100 may be a semiconductor substrate that is formed of or includes silicon, germanium, silicon-germanium, a compound semiconductor material, or the like. In an example embodiment, the substrate 100 may be a silicon wafer.

The first and second active regions PR and NR may be defined by a second trench TR2, which is formed in an upper portion of the substrate 100. The second trench TR2 may be positioned between the first and second active regions PR and NR. The first and second active regions PR and NR may be spaced apart from each other, in a first direction D1, with the second trench TR2 interposed therebetween. Each of the first and second active regions PR and NR may be extended in a second direction D2 that is different from the first direction D1.

First active patterns AP1 and second active patterns AP2 may be provided on the first active region PR and the second active region NR, respectively. The first and second active patterns AP1 and AP2 may extend in the second direction D2 and may be parallel to each other. The first and second active patterns AP1 and AP2 may be portions of the substrate 100 protruding in a vertical direction (e.g., a third direction D3). A first trench TR1 may be defined between adjacent ones of the first active patterns AP1 and between adjacent ones of the second active patterns AP2. The first trench TR1 may be shallower than the second trench TR2.

A device isolation layer ST may fill the first and second trenches TR1 and TR2. The device isolation layer ST may be formed of or include silicon oxide. The upper portions of the first and second active patterns AP1 and AP2 may be protruding patterns, which are vertically extended above the device isolation layer ST (e.g., see FIG. 2D). Each of the upper portions of the first and second active patterns AP1 and AP2 may be shaped like a fin. The device isolation layer ST may not cover the upper portions of the first and second active patterns AP1 and AP2. The device isolation layer ST may cover lower portions of side surfaces of the first and second active patterns AP1 and AP2.

First source/drain patterns SD1 may be provided in the upper portions of the first active patterns AP1. The first source/drain patterns SD1 may be impurity regions of a first conductivity type (e.g., p-type). A first channel pattern CH1 may be interposed between a pair of the first source/drain patterns SD1. Second source/drain patterns SD2 may be provided in the upper portions of the second active patterns AP2. The second source/drain patterns SD2 may be impurity regions of a second conductivity type (e.g., n-type). A second channel pattern CH2 may be interposed between a pair of the second source/drain patterns SD2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain patterns SD1 may include a semiconductor element (e.g., SiGe), whose lattice constant is larger than a lattice constant of a semiconductor element in the substrate 100. Accordingly, the first source/drain patterns SD1 may exert a compressive stress on the first channel patterns CH1. As an example, the second source/drain patterns SD2 may include the semiconductor element (e.g., Si) as the substrate 100.

Gate electrodes GE may be provided to cross the first and second active patterns AP1 and AP2 and extend in the first direction D1. The gate electrodes GE may be arranged to be spaced apart from each other with a first pitch P1 in the second direction D2. The gate electrodes GE may overlap the first and second channel patterns CH1 and CH2 when viewed in a plan view. Each of the gate electrodes GE may enclose a top surface and opposite side surfaces of each of the first and second channel patterns CH1 and CH2.

Referring back to FIG. 2D, the gate electrode GE may be provided on a first top surface TS1 of the first channel pattern CH1 and on at least one first side surface SW1 of the first channel pattern CH1. The gate electrode GE may be provided on a second top surface TS2 of the second channel pattern CH2 and on at least one second side surface SW2 of the second channel pattern CH2. For example, the transistor according to the present example embodiment may be a three-dimensional field effect transistor (e.g., FinFET), in which the gate electrode GE is disposed to three-dimensionally surround the channel patterns CH1 and CH2.

Referring back to FIGS. 1 and 2A to 2D, a pair of gate spacers GS may be disposed on opposite side surfaces of each of the gate electrodes GE. The gate spacers GS may extend along the gate electrodes GE and in the first direction D1. Top surfaces of the gate spacers GS may be higher than top surfaces of the gate electrodes GE. The top surfaces of the gate spacers GS may be coplanar with a top surface of a first interlayered insulating layer 110, which will be described below. The gate spacers GS may be formed of or include at least one of SiCN, SiCON, or SiN. In an example embodiment, the gate spacers GS may be a multi-layered structure, which includes at least two different materials selected from SiCN, SiCON, and SiN.

A gate capping pattern GP may be provided on each of the gate electrodes GE. The gate capping pattern GP may extend along the gate electrode GE and in the first direction D1. The gate capping pattern GP may be formed of or include at least one of materials, which have an etch selectivity with respect to first and second interlayered insulating layers 110 and 120 to be described below. For example, the gate capping patterns GP may be formed of or include at least one of SiON, SiCN, SiCON, or SiN.

A gate insulating layer GI may be interposed between the gate electrode GE and the first active pattern AP1 and between the gate electrode GE and the second active pattern AP2. The gate insulating layer GI may extend along a bottom surface of the gate electrode GE thereon. As an example, the gate insulating layer GI may cover the first top surface TS1 and the first side surfaces SW1 of the first channel pattern CH1. The gate insulating layer GI may cover the second top surface TS2 and both of the second side surfaces SW2 of the second channel pattern CH2. The gate insulating layer GI may cover a top surface of the device isolation layer ST below the gate electrode GE (e.g., see FIG. 2D).

In an example embodiment, the gate insulating layer GI may be formed of or include a high-k dielectric material, whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another example embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. In contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). In some example embodiments, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the aluminum as the dopants may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts are not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an example embodiment, the ferroelectric layer may have a thickness ranging from 0.5 to 10 nm, but the inventive concepts are not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal and a second metal on the first metal. The first metal may be provided on the gate insulating layer GI and may be adjacent to the first and second channel patterns CH1 and CH2. The first metal may include a work function metal adjusting a threshold voltage of a transistor. By adjusting a thickness and composition of the first metal, it may be possible to realize a transistor having a desired threshold voltage.

The first metal may include a metal nitride layer. For example, the first metal may include at least one metal, which is selected from the group consisting of titanium (Ti), tantalum (Ta), aluminum (Al), tungsten (W) and molybdenum (Mo), and nitrogen (N). In an example embodiment, the first metal may further include carbon (C). The first metal may include a plurality of work function metal layers, which are stacked.

The second metal may include a metal having electric resistance lower than the first metal. For example, the second metal may include at least one metal selected from the group consisting of tungsten (W), aluminum (Al), titanium (Ti), and tantalum (Ta).

A first interlayered insulating layer 110 may be provided on the substrate 100. The first interlayered insulating layer 110 may cover the gate spacers GS and the first and second source/drain patterns SD1 and SD2. A top surface of the first interlayered insulating layer 110 may be substantially coplanar with top surfaces of the gate capping patterns GP and the top surfaces of the gate spacers GS. A second interlayered insulating layer 120 may be provided on the first interlayered insulating layer 110 to cover the gate capping patterns GP. A third interlayered insulating layer 130 may be provided on the second interlayered insulating layer 120. A fourth interlayered insulating layer 140 may be provided on the third interlayered insulating layer 130. In an example embodiment, the first to fourth interlayered insulating layers 110 to 140 may be formed of or include silicon oxide.

A pair of isolation structures DB may be provided at both sides of the logic cell LC, which are opposite to each other in the second direction D2. The isolation structure DB may be extended in the first direction D1 and parallel to the gate electrodes GE. In an example embodiment, a pitch between the isolation structure DB and the gate electrode GE adjacent to each other may be equal to the first pitch P1.

The isolation structure DB may be provided to penetrate the first and second interlayered insulating layers 110 and 120 and may be extended into the first and second active patterns AP1 and AP2. The isolation structure DB may penetrate the upper portion of each of the first and second active patterns AP1 and AP2. The isolation structure DB may separate the first and second active regions PR and NR of the logic cell LC from the active region of a neighboring logic cell.

Active contacts AC may be provided to penetrate the first and second interlayered insulating layers 110 and 120 and may be electrically connected to the first and second source/drain patterns SD1 and SD2, respectively. Each of the active contacts AC may be provided between a pair of the gate electrodes GE.

The active contact AC may be a self-aligned contact. For example, the active contact AC may be formed by a self-alignment process using the gate capping pattern GP and the gate spacer GS. For example, the active contact AC may cover at least a portion of a side surface of the gate spacer GS. Although not shown, in certain example embodiments, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal-silicide materials (e.g., titanium silicide, tantalum silicide, tungsten silicide, nickel silicide, and cobalt-silicide).

A gate contact GC may be provided to penetrate the second interlayered insulating layer 120 and the gate capping pattern GP and to be connected to the gate electrode GE. When viewed in a plan view, the gate contact GC may be provided between the first and second active regions PR and NR. A bottom surface of the gate contact GC may be in contact with the top surface of the gate electrode GE. The gate contact GC may have a top surface that is coplanar with a top surface of the second interlayered insulating layer 120.

Each of the active and gate contacts AC and GC may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. The barrier pattern BM may include at least one of a metal layer or a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. The first metal layer M1 may include first and second power lines PIL1 and PIL2, first to fifth lower interconnection lines LIL1 to LIL5, and lower vias VI. The lower vias VI may be provided below the first and second power lines PIL1 and PIL2 and the first to fifth lower interconnection lines LIL1 to LIL5.

The first and second power lines PIL1 and PIL2 may be provided to cross the logic cell LC and may be extended in the second direction D2 to be parallel to each other. The first and second power lines PIL1 and PIL2 may be applied with a drain voltage VDD and a source voltage VSS, respectively.

Referring to FIG. 1, a first cell boundary CB1 extending in the second direction D2 may be defined in a region of the logic cell LC. A second cell boundary CB2 extending in the second direction D2 may be defined in a region of the logic cell LC opposite to the first cell boundary CB1. The first power line PIL1 to which the drain voltage VDD is applied, may be disposed on the first cell boundary CB1. That is, the first power line PIL1 applied with the drain voltage VDD may be extended along the first cell boundary CB1 and in the second direction D2. The second power line PIL2, to which the source voltage VSS (e.g., the ground voltage) is applied, may be disposed on the second cell boundary CB2. In other words, the second power line PIL2 applied with the source voltage VSS may be extended along the second cell boundary CB2 and in the second direction D2.

The first to fifth lower interconnection lines LIL1 to LIL5 may be disposed between the first power line PIL1 and the second power line PIL2. The first to fifth lower interconnection lines LIL1 to LIL5 may be extended in the second direction D2 to be parallel to each other. Each of the first to fifth lower interconnection lines LIL1 to LIL5 may have a line shape or a bar shape, when viewed in a plan view. The first to fifth lower interconnection lines LIL1 to LIL5 may be arranged to be spaced apart from each other with a second pitch P2 in the first direction D1. The second pitch P2 may be smaller than the first pitch P1.

A line width of each of the first and second power lines PIL1 and PIL2 may be a first width W1. A line width of each of the first to fifth lower interconnection lines LIL1 to LIL5 may be a second width W2. The second width W2 may be smaller than the first width W1. For example, the second width W2 may be smaller than 12 nm. The first width W1 may be larger than 12 nm.

The lower vias VI may be interposed between the first and second power lines PIL1 and PIL2 and the active contacts AC. The lower vias VI may be interposed between the first to fifth lower interconnection lines LIL1 to LIL5 and the active contacts AC and the gate contacts GC.

Each of the first and second power lines PIL1 and PIL2 and the first to fifth lower interconnection lines LIL1 to LIL5 may include a first barrier metal pattern BAP1 and a first metal pattern MEP1 on the first barrier metal pattern BAP1.

The first barrier metal pattern BAP1 may have a U-shaped section. A top surface of the first barrier metal pattern BAP1 may be located at substantially the same level as a top surface of the third interlayer insulating layer 130. As an example, the top surface of the first barrier metal pattern BAP1 may be lower than the top surface of the third interlayer insulating layer 130.

The first barrier metal pattern BAP1 may improve an adhesion property between the first metal pattern MEP1 and the third interlayer insulating layer 130. The first barrier metal pattern BAP1 may serve as a barrier preventing metallic elements in the first metal pattern MEP1 from being diffused into the third interlayer insulating layer 130. The first barrier metal pattern BAP1 may be formed of or include at least one of tantalum nitride (TaN), titanium nitride (TiN), tantalum oxide (TaO), titanium oxide (TiO), manganese nitride (MnN), or manganese oxide (MnO).

The first metal pattern MEP1 may be provided on the first barrier metal pattern BAP1. The first barrier metal pattern BAP1 may cover both side surfaces and a bottom surface of the first metal pattern MEP1. A top surface of the first metal pattern MEP1 may be located at a level that is equal to or lower than the top surface of the third interlayer insulating layer 130. Although not shown, the first metal pattern MEP1 may have a convex top surface.

A volume of the first metal pattern MEP1 may be larger than a volume of the first barrier metal pattern BAP1. The first metal pattern MEP1 may be formed of or include at least one of copper (Cu), aluminum (Al), ruthenium (Ru), cobalt (Co), tungsten (W), molybdenum (Mo), aluminum binary alloys (e.g., $Al_3Sc$, $Nb_3Al$, and AlRu), molybdenum binary alloys (e.g., MoTa and $Co_3Mo$), ruthenium binary alloys, nickel binary alloys, MAX, or combinations thereof. The MAX may be metal phase compounds represented by the formula $M_{n+1}AX_n$, where n is 1, 2, or 3, M is a transition metal, A is an element in a group 13 or 14, and X is C and/or N. As an example, the MAX may be $V_2SiN$, $V_2AlC$, or $Cr_2AlC$.

In an example embodiment, although not shown, a metal capping pattern may be additionally provided on the top surface of the first metal pattern MEP1. The metal capping pattern may have a thin and uniform thickness. For example, the metal capping pattern may be formed of or include at least one of ruthenium (Ru), cobalt (Co), or graphene.

A dielectric layer DOD and an etch stop layer ESL may be interposed between the third and fourth interlayer insulating layers 130 and 140. The dielectric layer DOD may be in direct contact with the top surface of the third interlayer insulating layer 130. The dielectric layer DOD may be locally disposed on the top surface of the third interlayer insulating layer 130 but not on the interconnection lines PILL PIL2, and LIL1 to LIL5 of the first metal layer M1. This is because the dielectric layer DOD is selectively formed on only the top surface of the third interlayer insulating layer 130 except on the interconnection line. Each of the interconnection lines PILL PIL2, and LIL1 to LIL5 of the first metal layer M1 may have a top surface that is lower than the top surface of the dielectric layer DOD.

The dielectric layer DOD may contain elements X and Y. Here, the element X is an element selected from the group consisting of Si, Ge, Al, Zr, Y, Hf, and Mo, and the element Y may be O or N. The dielectric layer DOD may further include carbon (C). In an example embodiment, the dielectric layer DOD may be formed of or include substantially the same material as the third interlayer insulating layer 130. As an example, the dielectric layer DOD may be formed of or include SiOC.

The etch stop layer ESL may be provided on the dielectric layer DOD. The etch stop layer ESL may directly cover the dielectric layer DOD. The etch stop layer ESL may cover the top surfaces of the interconnection lines PIL1 PIL2, and LIL1 to LIL5 which are not covered with the dielectric layer DOD. That is, the etch stop layer ESL may be in direct contact with the top surface of the dielectric layer DOD and the top surfaces of the interconnection lines PIL1 PIL2, and LIL1 to LIL5.

The etch stop layer ESL may include a metal oxide layer or a metal nitride layer. The metal oxide layer or the metal nitride layer may contain at least one metallic element selected from the group consisting of Al, Zr, Y, Hf, and Mo. For example, the etch stop layer ESL may be formed of or include aluminum oxide, hafnium oxide, hafnium zirconium oxide, aluminum nitride, hafnium nitride, or hafnium zirconium nitride.

The etch stop layer ESL may include a single layer or two or more stacked layers. The etch stop layer ESL will be described in more detail with reference to FIG. 3.

The fourth interlayer insulating layer 140 may cover a top surface of the etch stop layer ESL. A second metal layer M2 may be provided in the fourth interlayer insulating layer 140. The second metal layer M2 may include first to fourth upper interconnection lines UIL1 to UIL4. The first to fourth upper interconnection lines UIL1 to UIL4 may be extended in the first direction D1 to be parallel to each other. When viewed in a plan view, at least one or each of the first to fourth upper interconnection lines UIL1 to UIL4 may have a line shape or a bar shape. As an example, the first to third upper interconnection lines UIL1 to UIL3 may be arranged in the second direction D2.

Each of the first to fourth upper interconnection lines UIL1 to UIL4 may include a second barrier metal pattern BAP2 and a second metal pattern MEP2 on the second barrier metal pattern BAP2. The second barrier metal pattern BAP2 and the second metal pattern MEP2 may be configured to have substantially the same features as the first barrier metal pattern BAP1 and the first metal pattern MEP1 described above.

Figure 2A:
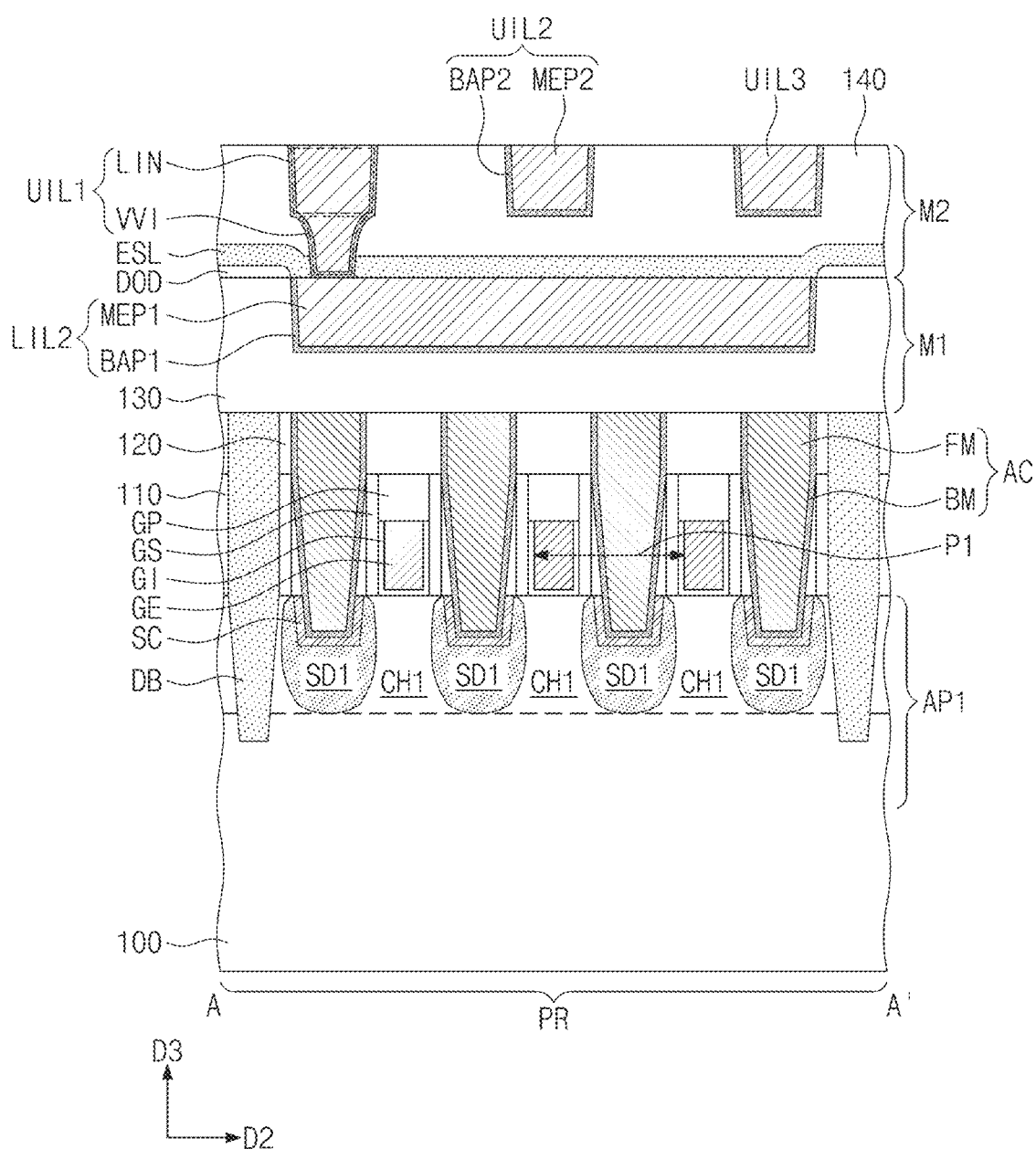
FIGS. 2A to 2D are sectional views taken along lines A-A', B-B', C-C', and D-D' of FIG. 1, respectively.
Figure 2B:
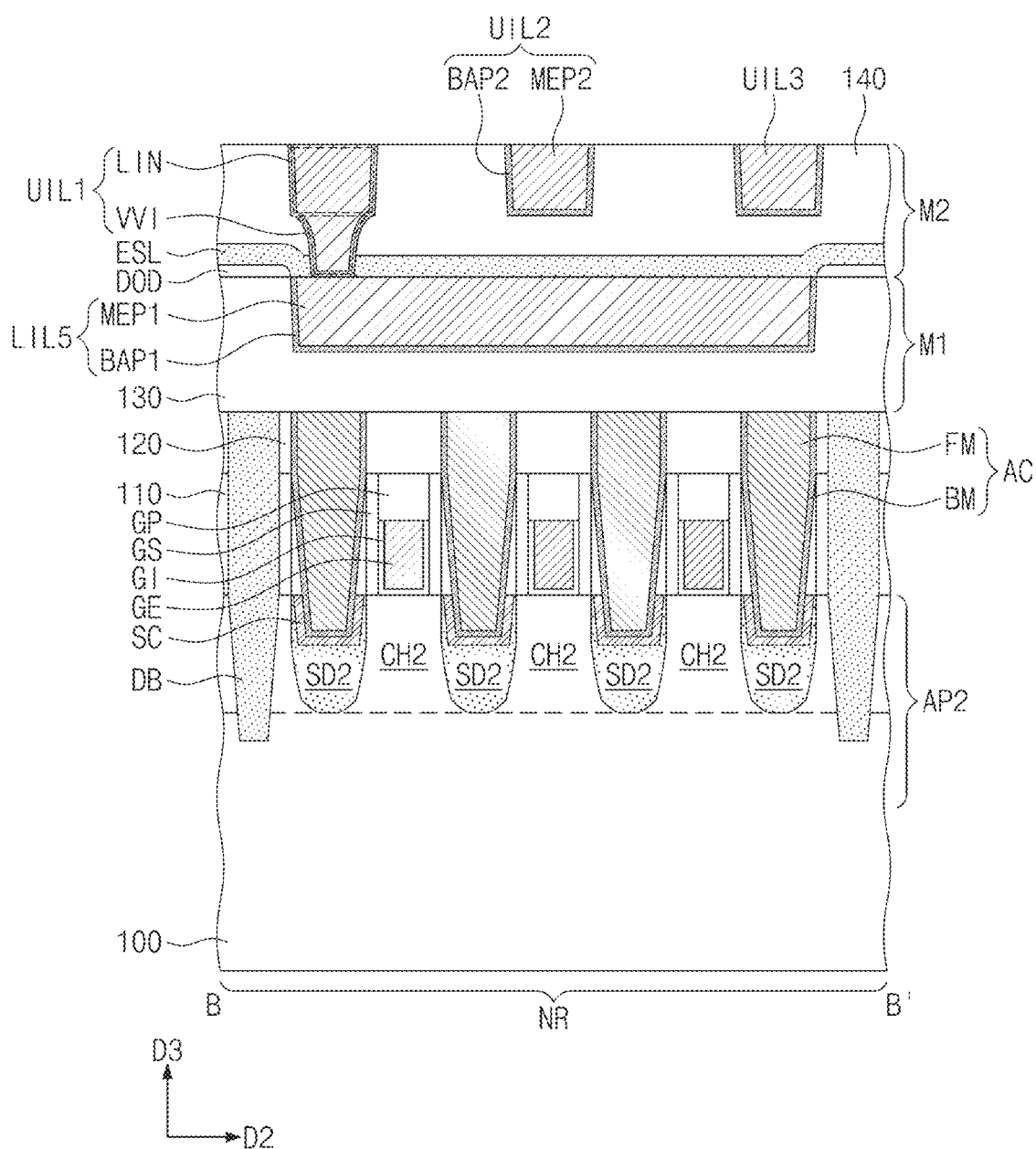
Figure 2C:
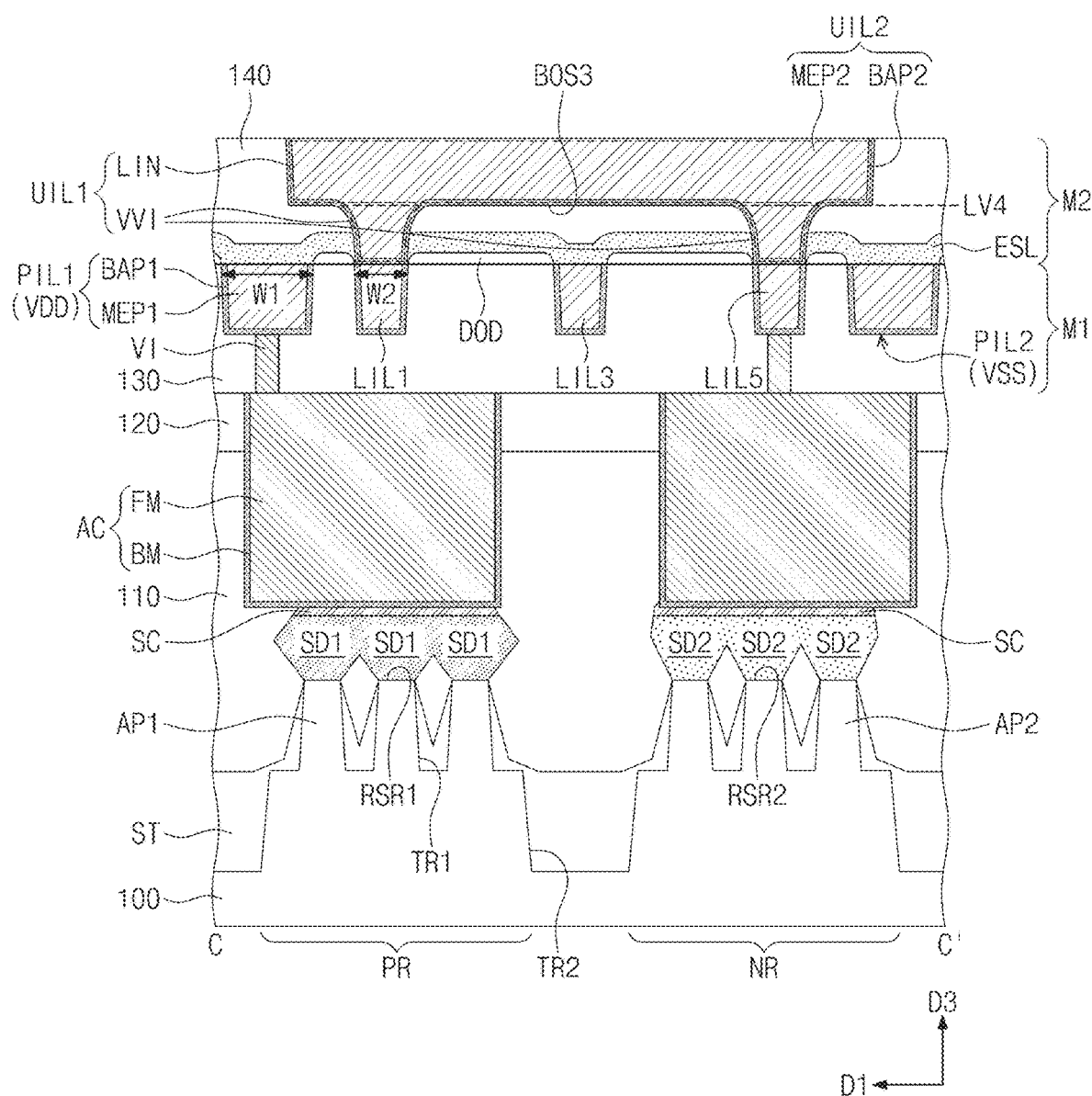
Figure 3:
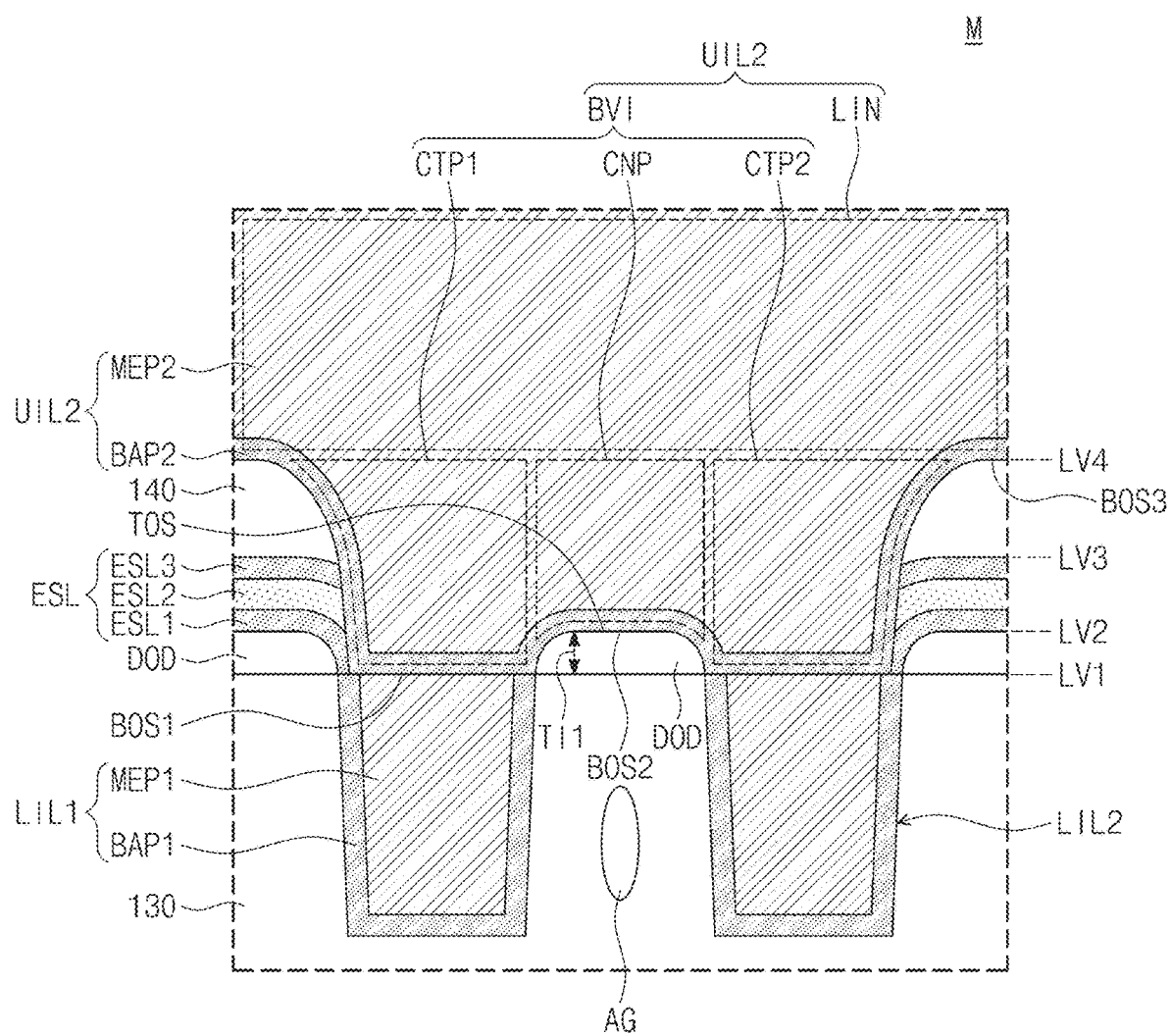
FIG. 3 is an enlarged sectional view of a portion M of FIG. 2D.

In an example embodiment, referring to FIGS. 2A to 2C, the first upper interconnection line UIL1 may include a line portion LIN and upper vias VVI thereunder. The line portion LIN may be provided in an upper portion of the fourth interlayer insulating layer 140 and may be extended in the first direction D1. The upper vias VVI may be provided in a lower portion of the fourth interlayer insulating layer 140 and may be extended from the line portion LIN toward the first and fifth lower interconnection lines LIL1 and LIL5, respectively. That is, the upper vias VVI may be interposed between the first metal layer M1 and the line portion LIN to connect them to each other.

The upper via VVI may be provided to penetrate the fourth interlayer insulating layer 140 and the etch stop layer ESL and to extend toward the first metal layer M1. The upper via VVI may be in contact with a top surface of a corresponding one of the first and fifth lower interconnection lines LIL1 and LIL5. Although not shown, the upper via VVI may be in contact with at least a portion of the dielectric layer DOD adjacent thereto.

The line portion LIN and the upper vias VVI may be connected to each other, thereby forming a single conductive object (e.g., the first upper interconnection line UIL1). The line portion LIN and the upper vias VVI may be formed by a dual damascene process, and in this case, they may form the first upper interconnection line UIL1, which is one of the upper interconnection lines.

Figure 2D:
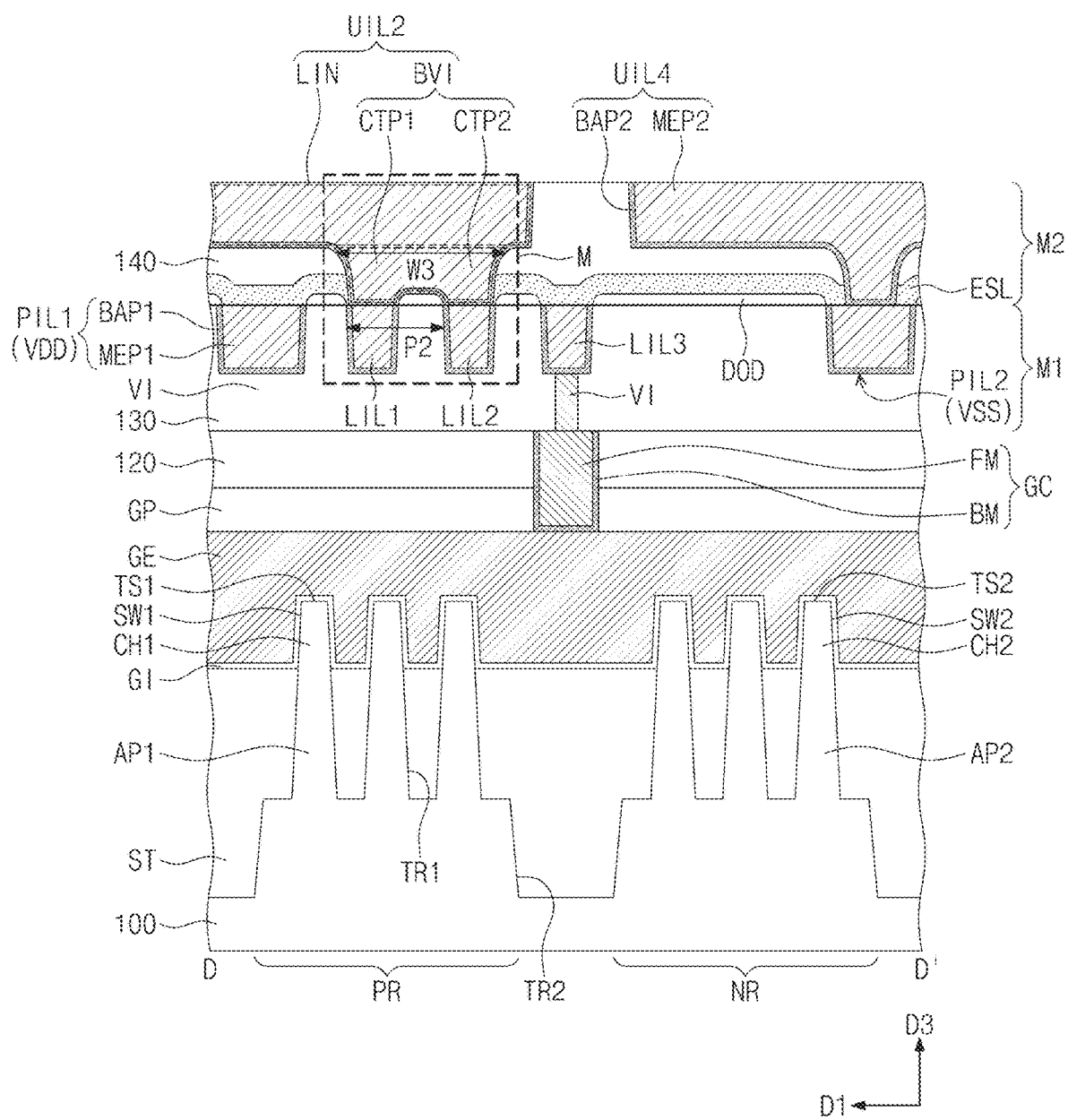

In an example embodiment, referring to FIG. 2D, a second upper interconnection line UIL2 may include the line portion LIN and a bar via BVI thereunder. The bar via BVI may be provided in a lower portion of the fourth interlayer insulating layer 140 and may be extended from the line portion LIN toward the first and second lower interconnection lines LIL1 and LIL2. That is, the bar via BVI may be interposed between the first metal layer M1 and the line portion LIN to connect them to each other.

A pair of the first and second lower interconnection lines LIL1 and LIL2, which are adjacent to each other, may be connected to each other by one of the bar vias BVI. For example, a width W3 of the bar via BVI in the first direction D1 may be equal to or larger than the second pitch P2 between the first and second lower interconnection lines LIL1 and LIL2.

The bar via BVI may be provided to penetrate the fourth interlayer insulating layer 140 and the etch stop layer ESL and to be in contact with the top surfaces of the first and second lower interconnection lines LIL1 and LIL2. However, the bar via BVI may not penetrate the dielectric layer DOD between the first and second lower interconnection lines LIL1 and LIL2. The bar via BVI may be in direct contact with the dielectric layer DOD between the first and second lower interconnection lines LIL1 and LIL2.

The line portion LIN and the bar via BVI may be connected to each other, thereby forming a single conductive object (e.g., the second upper interconnection line UIL2). The line portion LIN and the bar via BVI may be formed by a dual damascene process, and in this case, they may form the second upper interconnection line UIL2, which is one of the upper interconnection lines.

The bar via BVI of the second upper interconnection line UIL2 according to the present example embodiment will be described in more detail with reference to FIG. 3. An air gap AG may be interposed between the first and second lower interconnection lines LIL1 and LIL2. The air gap AG may be provided in the third interlayer insulating layer 130 between the first and second lower interconnection lines LIL1 and LIL2. In an example embodiment, the air gap AG may be omitted.

The etch stop layer ESL may include a first etch stop layer ESL1, a second etch stop layer ESL2, and a third etch stop layer ESL3. The first etch stop layer ESL1 may directly cover the first and second lower interconnection lines LIL1 and LIL2 and the dielectric layer DOD. The second etch stop layer ESL2 may cover a top surface of the first etch stop layer ESL1. The third etch stop layer ESL3 may cover a top surface of the second etch stop layer ESL2.

The first etch stop layer ESL1 may be a layer having a high dielectric constant and a low density. The first etch stop layer ESL1 may be a metal oxide layer or a metal nitride layer, which contains at least one metal selected from the group consisting of Al, Zr, Y, Hf, and Mo. For example, the first etch stop layer ESL1 may be formed of or include at least one of aluminum oxide, hafnium oxide, hafnium zirconium oxide, aluminum nitride, hafnium nitride, or hafnium zirconium nitride.

The second etch stop layer ESL2 may be a layer having a low dielectric constant and a high density. The dielectric constant of the second etch stop layer ESL2 may be lower than the dielectric constant of the first etch stop layer ESL1. The density of the second etch stop layer ESL2 may be higher than the density of the first etch stop layer ESL1.

The second etch stop layer ESL2 may contain elements X and Y and carbon (C). Here, the element X is an element selected from the group consisting of Si, Ge, Al, Zr, Y, Hf, and Mo, and the element Y may be O or N. For example, the second etch stop layer ESL2 may be formed of or include SiOC, SiNC, GeOC, or GeNC.

A content of carbon (C) in the second etch stop layer ESL2 may range from 10 at % to 25 at %. For example, the content of carbon (C) in the second etch stop layer ESL2 may range from 15 at % to 20 at %. A content of the element X in the second etch stop layer ESL2 may range from 30 at % to 50 at %.

The third etch stop layer ESL3 may be a metal oxide layer which contains at least one metallic element selected from the group consisting of Al, Zr, Y, Hf, and Mo. For example, the third etch stop layer ESL3 may be formed of or include aluminum oxide. In an example embodiment, the third etch stop layer ESL3 may be formed of or include the same material as the first etch stop layer ESL1. In another example embodiment, the third etch stop layer ESL3 may be formed of or include a material different from the first etch stop layer ESL1. A dielectric constant of the third etch stop layer ESL3 may be higher than the dielectric constant of the second etch stop layer ESL2. A density of the third etch stop layer ESL3 may be lower than the density of the second etch stop layer ESL2.

A thickness of the second etch stop layer ESL2 may be larger than a thickness of each of the first and third etch stop layers ESL1 and ESL3. For example, the thickness of each of the first and third etch stop layers ESL1 and ESL3 may range from 2 nm to 5 nm. The thickness of the second etch stop layer ESL2 may range from 3 nm to 10 nm.

The bar via BVI of the second upper interconnection line UIL2 may include a first contact portion CTP1, a second contact portion CTP2, and a connecting portion CNP between the first and second contact portions CTP1 and CTP2. The first contact portion CTP1 may be provided to penetrate the first to third etch stop layers ESL1 to ESL3 and to be in contact with the top surface of the first lower interconnection line LIL1. The second contact portion CTP2 may be provided to penetrate the first to third etch stop layers ESL1 to ESL3 and to be in contact with the top surface of the second lower interconnection line LIL2. The connecting portion CNP may connect the first and second contact portions CTP1 and CTP2 to each other.

In an example embodiment, the etch stop layer ESL may be a triple etch stop layer, which are composed of three etch stop layers (e.g., the first etch stop layer ESL1, the second etch stop layer ESL2 and the third etch stop layer ESL3). The triple etch stop layer ESL according to the present example embodiment may make it possible to realize a very high etch selectivity. Accordingly, the first and second contact portions CTP1 and CTP2 of the second upper interconnection line UIL2 may be in stable contact with the first and second lower interconnection lines LIL1 and LIL2, without any process failure.

The dielectric layer DOD may be interposed between the first and second contact portions CTP1 and CTP2. A thickness TB of the dielectric layer DOD may be increased until it reaches a maximum value and then may be decreased, as it goes from the first contact portion CTP1 to the second contact portion CTP2. That is, the dielectric layer DOD may have a dome shape. A bottom surface BOS2 of the connecting portion CNP may be in direct contact with a top surface TOS of the dielectric layer DOD.

A bottom surface BOS1 of each of the first and second contact portions CTP1 and CTP2 may be positioned at a first level LV1. The top surface of the third interlayer insulating layer 130 may also be positioned at the first level LV1. The bottom surface BOS2 of the connecting portion CNP may be positioned at a second level LV2. The second level LV2 may be higher than the first level LV1. The top surface of the dielectric layer DOD may also be positioned at the second level LV2.

The top surface of the etch stop layer ESL (e.g., a top surface of the third etch stop layer ESL3) may be located at a third level LV3. The second level LV2 may be a level between the first level LV1 and the third level LV3. A bottom surface BOS3 of the line portion LIN may be located at a fourth level LV4. The fourth level LV4 may be higher than the third level LV3.

Referring back to FIG. 2C, the first upper interconnection line UIL1 may be connected to the first lower interconnection line LIL1 and the fifth lower interconnection line LIL5 through a plurality of the upper vias VVI, not through the bar-shaped via BVI. The upper vias VVI may be connected to each other through the line portion LIN. The bottom surface BOS3 of the line portion LIN connecting the upper vias VVI to each other may be located at the fourth level LV4, as described above. That is, the bottom surface BOS3 of the line portion LIN connecting the upper vias VVI to each other may be located at a level that is higher than the bottom surface BOS2 of the connecting portion CNP connecting the first and second contact portions CTP1 and CTP2 to each other.

In the case where the upper vias VVI of FIG. 2C are used instead of the bar via BVI of FIG. 3, it may be difficult to form the upper vias VVI on the first and second lower interconnection lines LIL1 and LIL2, respectively, which are disposed with a very small pitch (e.g., the second pitch P2). This is because there are restrictions in design rule and fine-patterning process. Meanwhile, the bar via BVI according to the present example embodiment may be formed to have a bar shape, and this may make it possible to simultaneously connect adjacent ones of interconnection lines which are spaced apart from each other with a very small pitch. As a result, it may be possible to increase a degree of freedom in constructing a routing structure through a BEOL process.

Figure 4:
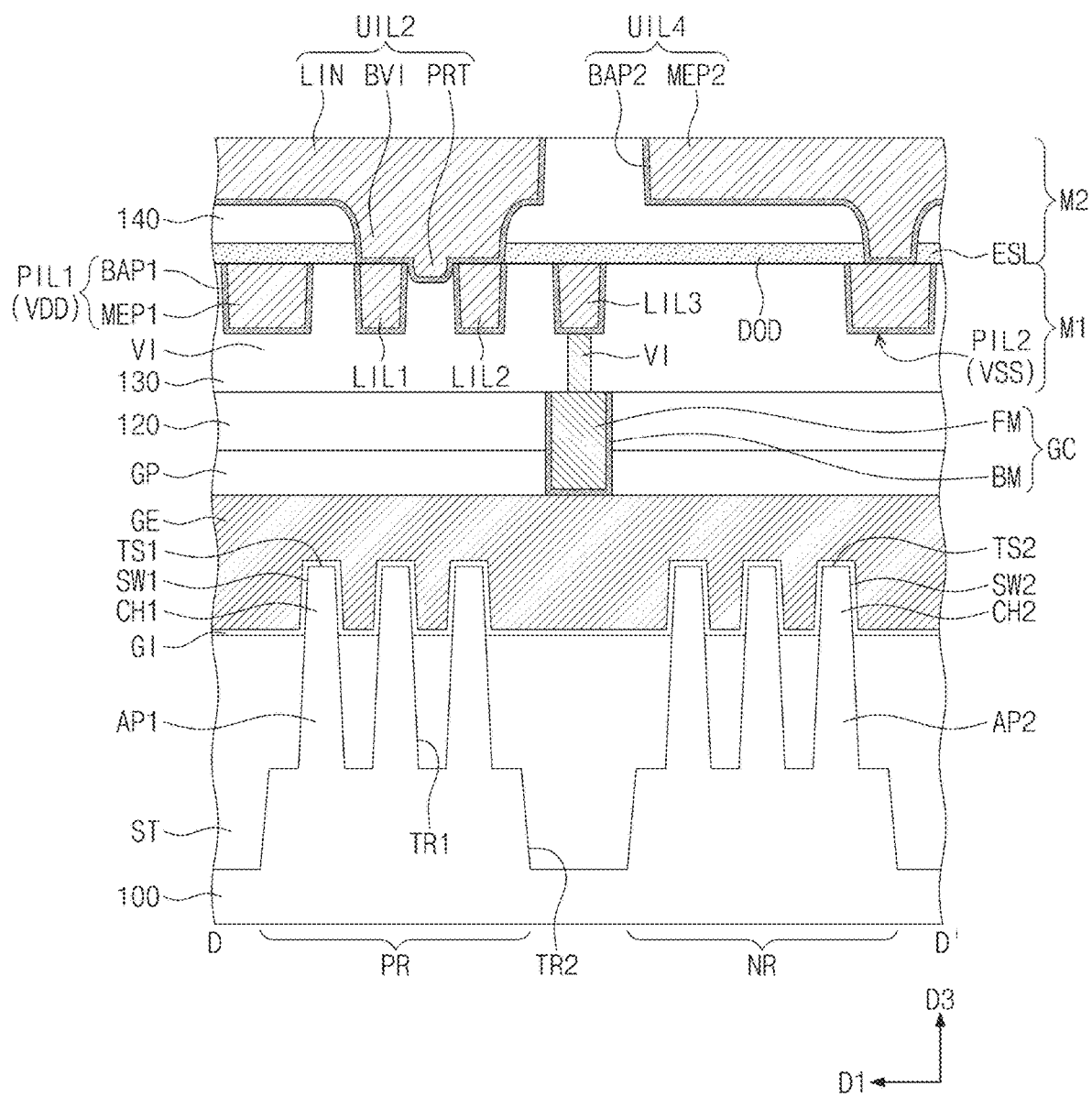
FIG. 4 is a sectional view taken along a line D-D' of FIG. 1 to illustrate a semiconductor device according to a comparative example.

FIG. 4 is a sectional view taken along a line D-D' of FIG. 1 to illustrate a semiconductor device according to a comparative example.

Referring to FIG. 4, the dielectric layer DOD in the afore-described example embodiment may be omitted from the semiconductor device according to the comparative example. In this case, the second upper interconnection line UIL2 may further include a protruding portion PRT that is extended downward from the bar via BVI. For example, the protruding portion PRT may be formed when the third interlayer insulating layer 130 between the first and second lower interconnection lines LIL1 and LIL2 is over-etched during the formation of the bar via BVI.

In the semiconductor device according to the comparative example, at least one of upper portions of the first and second lower interconnection lines LIL1 and LIL2 may be damaged by the protruding portion PRT therebetween. Furthermore, an upper portion of the third interlayer insulating layer 130 may be recessed, and in this case, electric characteristics of the semiconductor device may be deteriorated. In addition, although not shown, the protruding portion PRT may have an irregular profile causing a process failure (for example, the second barrier metal pattern BAP2 of the protruding portion PRT may not be connected to the second barrier metal pattern BAP2 of the bar via BVI).

In contrast, according to an example embodiment of the inventive concepts, the dielectric layer DOD on the third interlayer insulating layer 130 may mitigate or prevent the protruding portion PRT of FIG. 4 from being formed. Accordingly, it may be possible to mitigate or prevent the afore-described process failures, which are caused by the protruding portion PRT, and thereby to improve reliability and electrical characteristics of the semiconductor device.

Figure 10A:
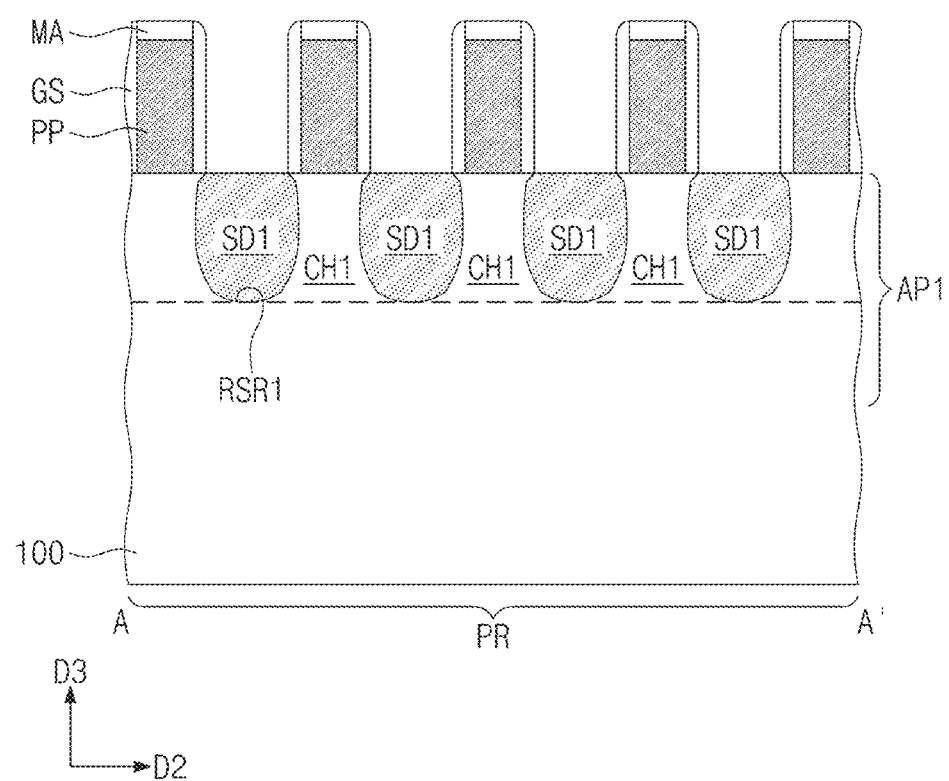
Figure 10B:
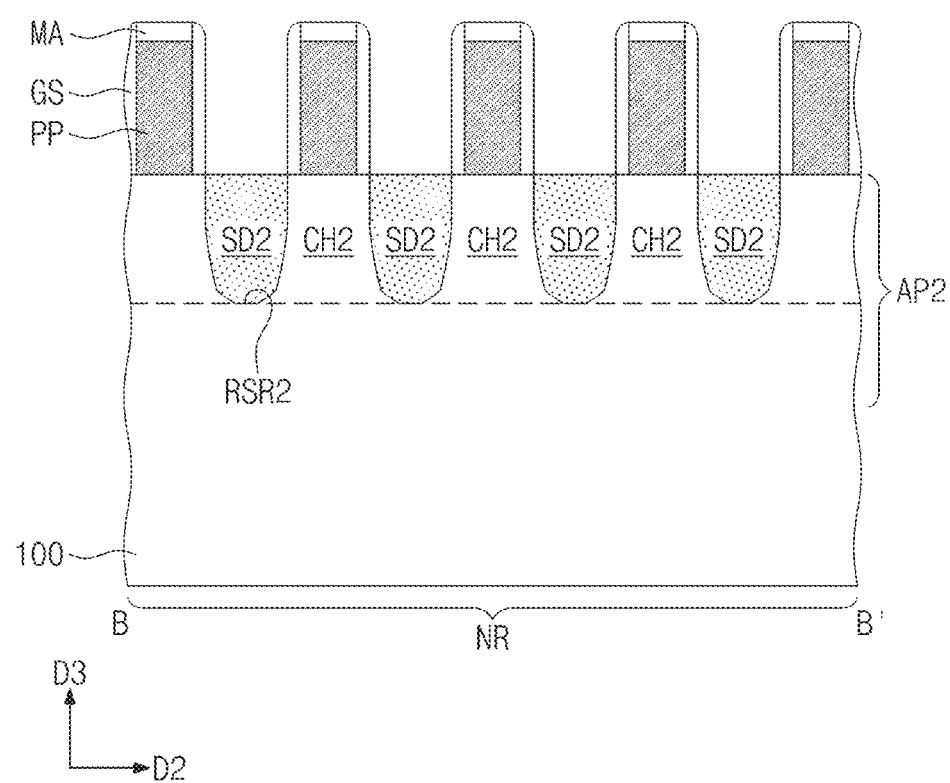
Figure 10C:
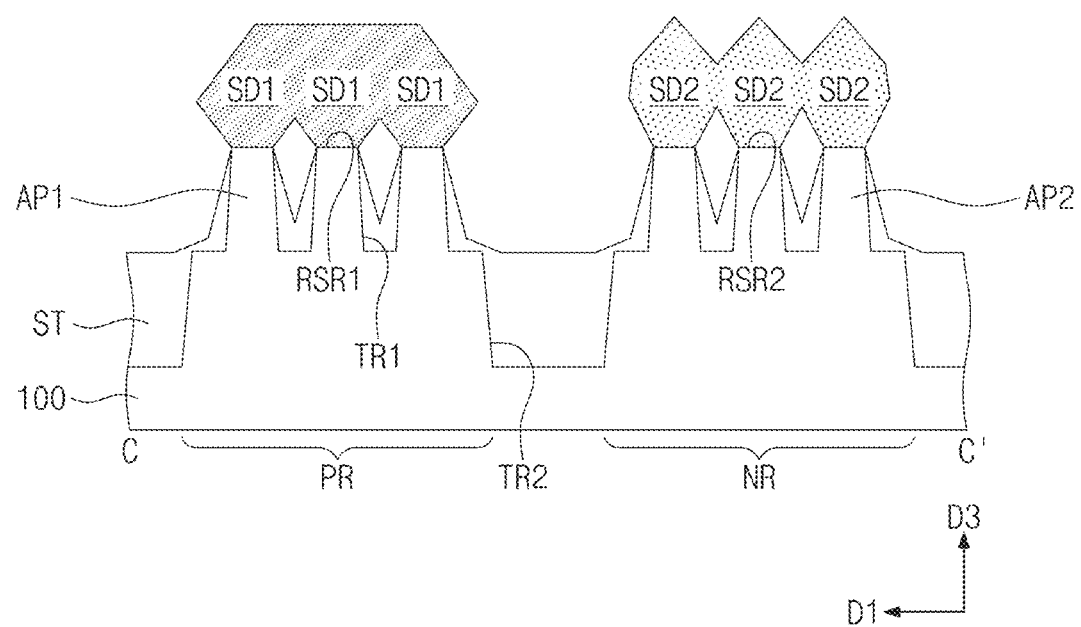
FIGS. 10C and 12C are sectional views taken along lines C-C' of FIGS. 9 and 11, respectively.
Figure 10D:
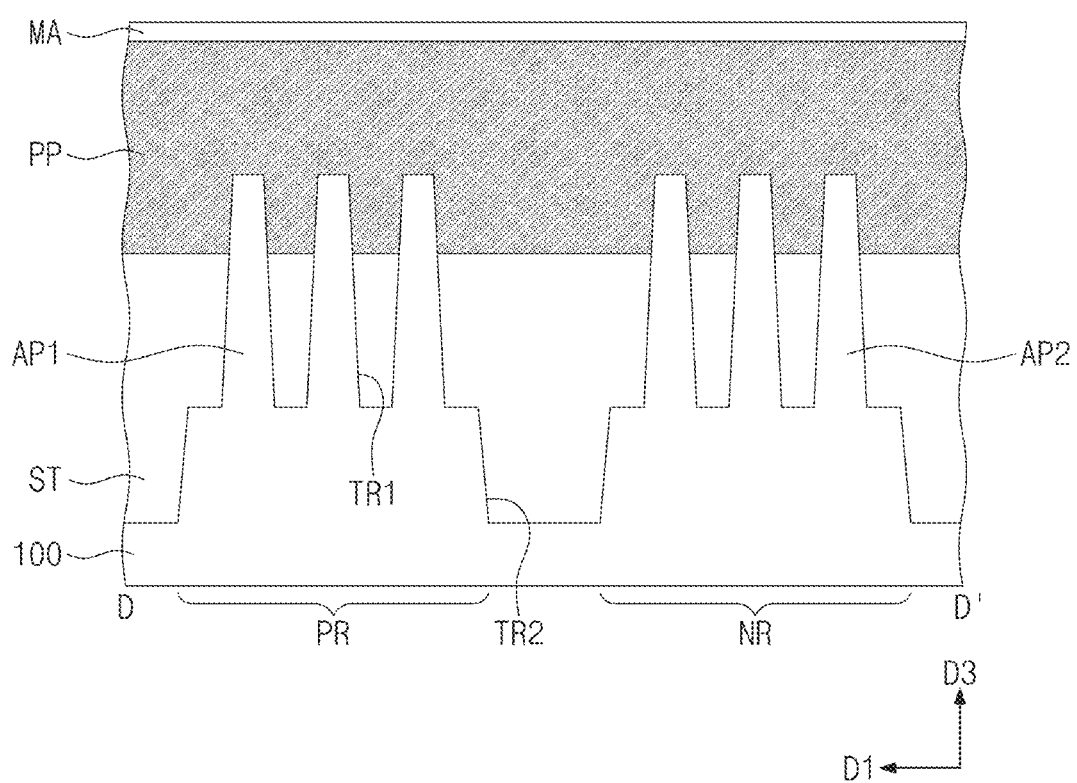
FIGS. 10D and 12D are sectional views taken along lines D-D' of FIGS. 9 and 11, respectively.
Figure 11:
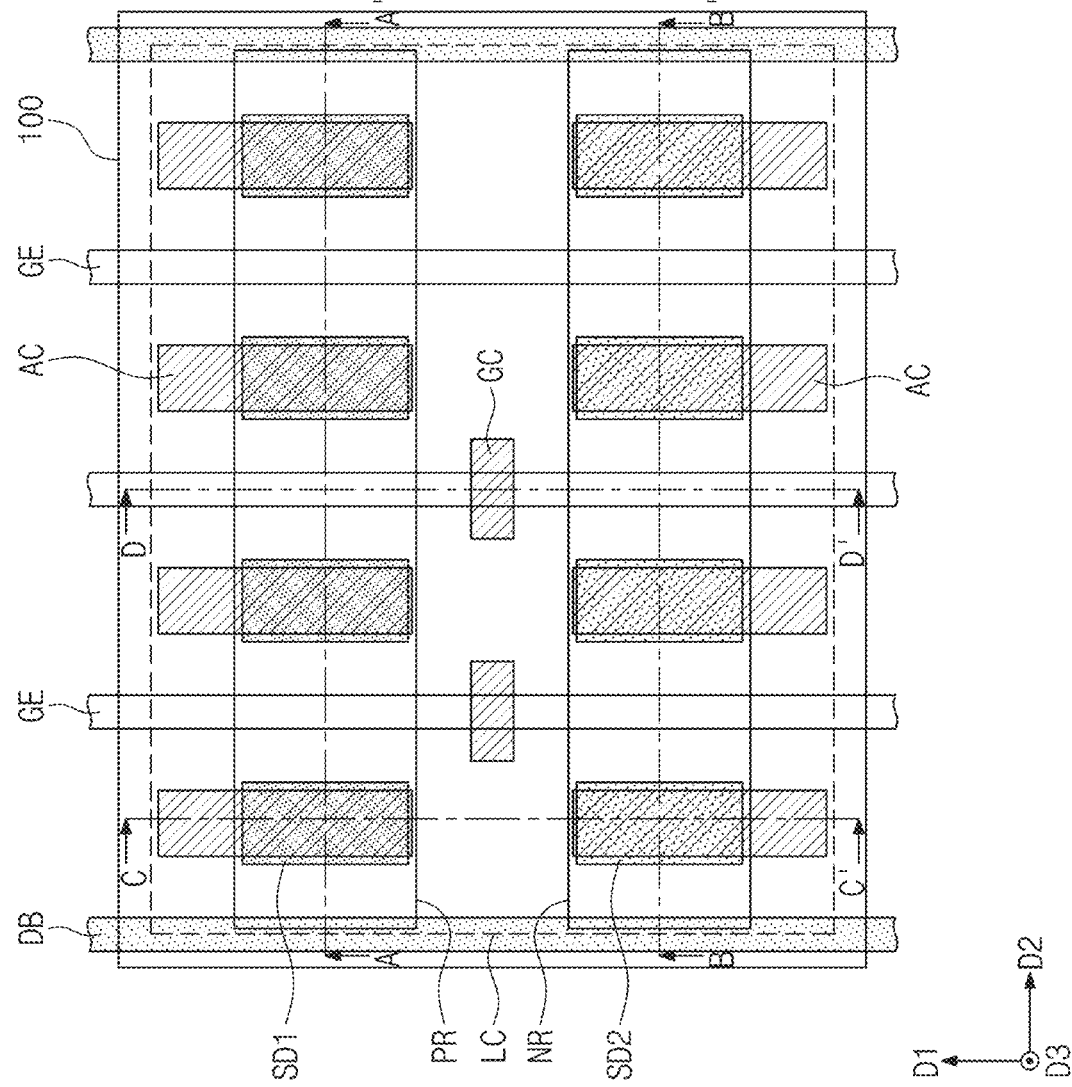
Figure 12A:
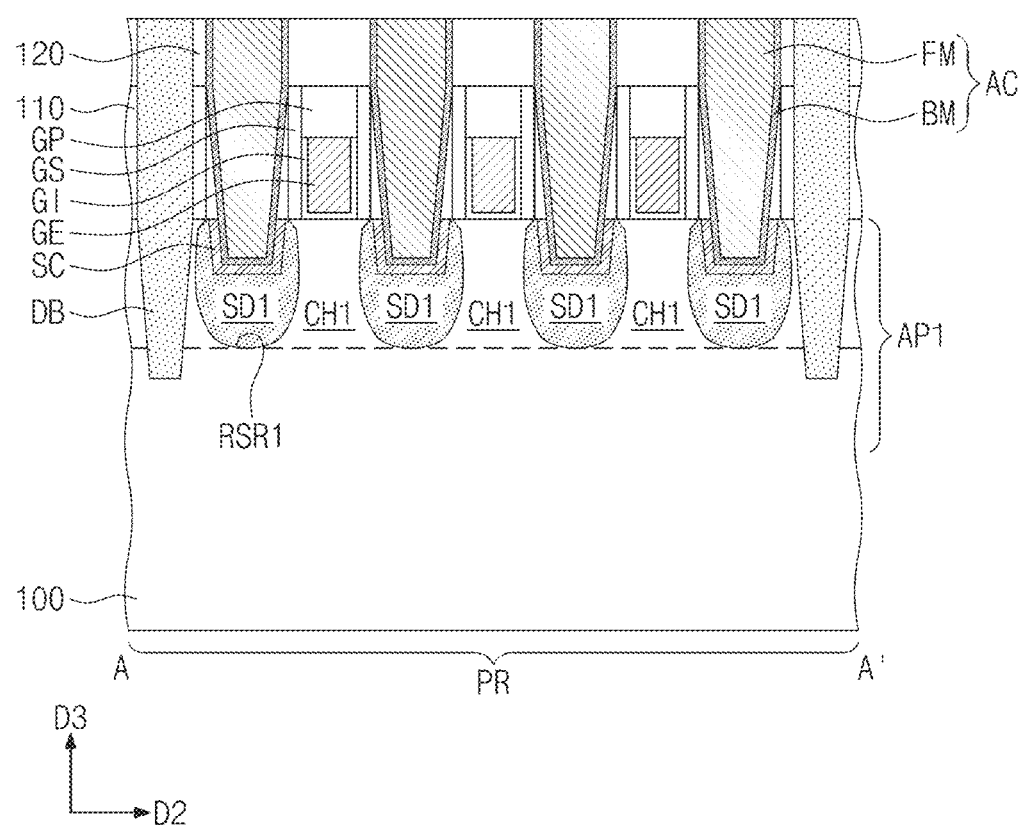
Figure 12B:
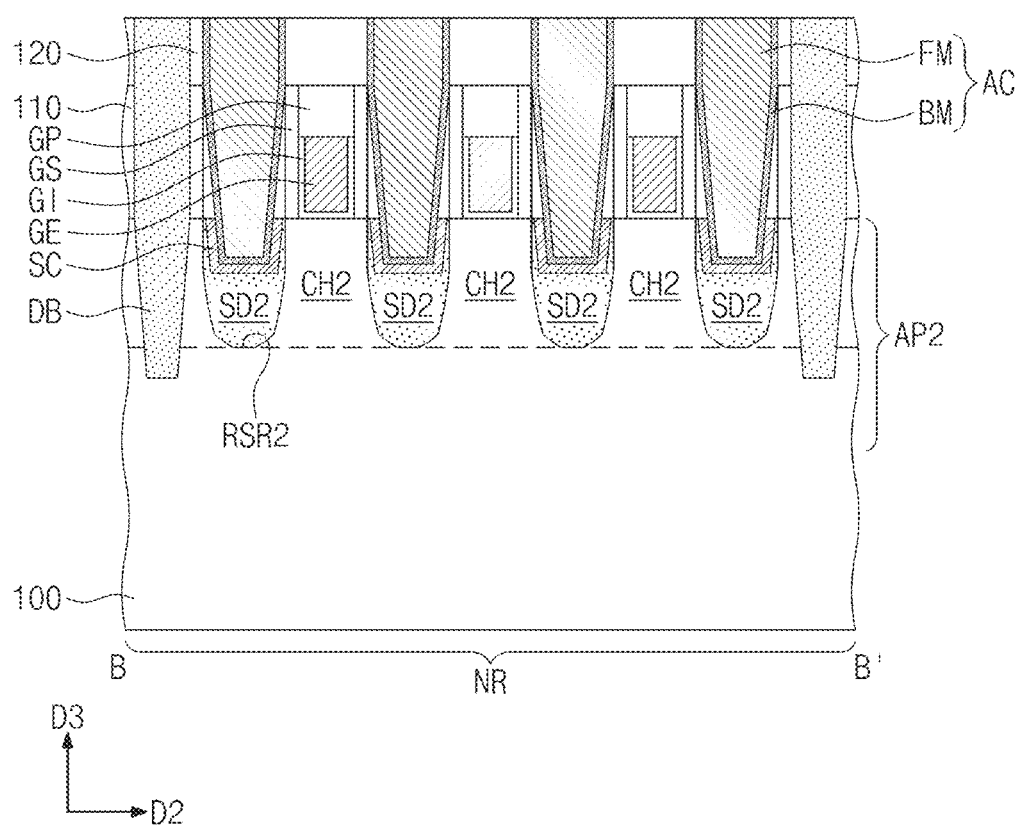
Figure 12C:
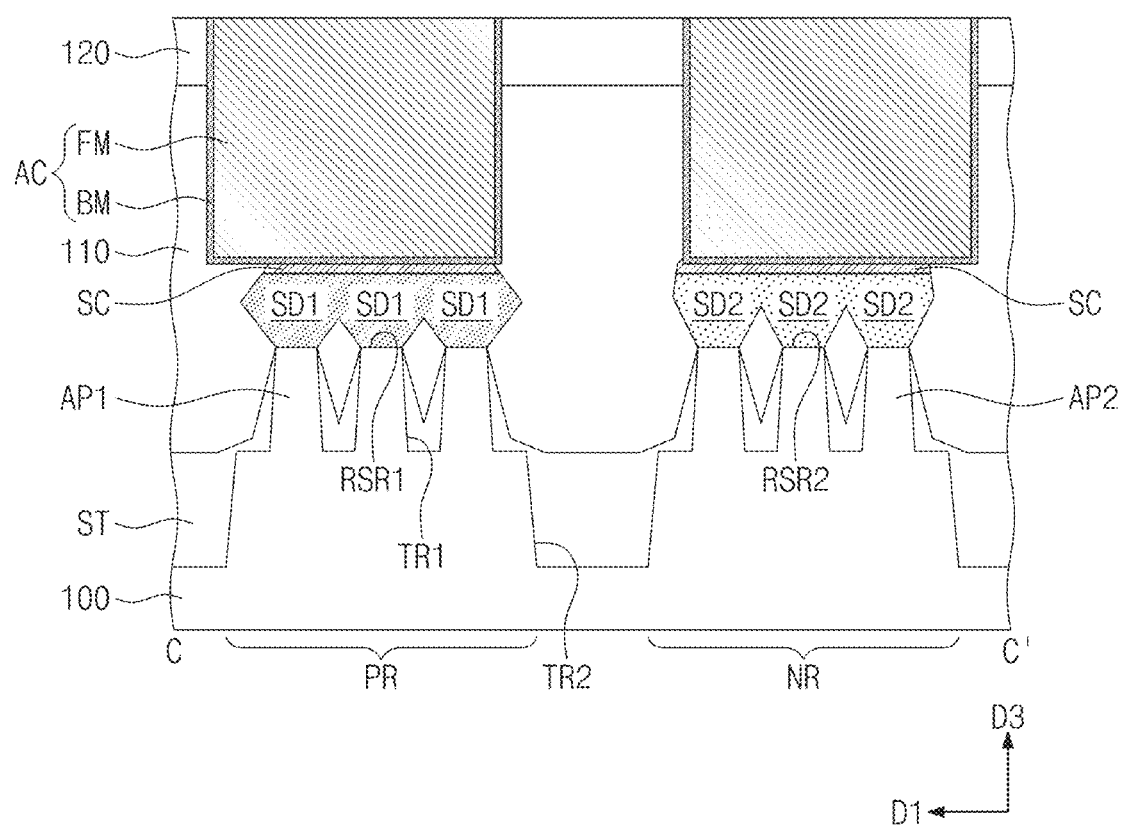
Figure 12D:
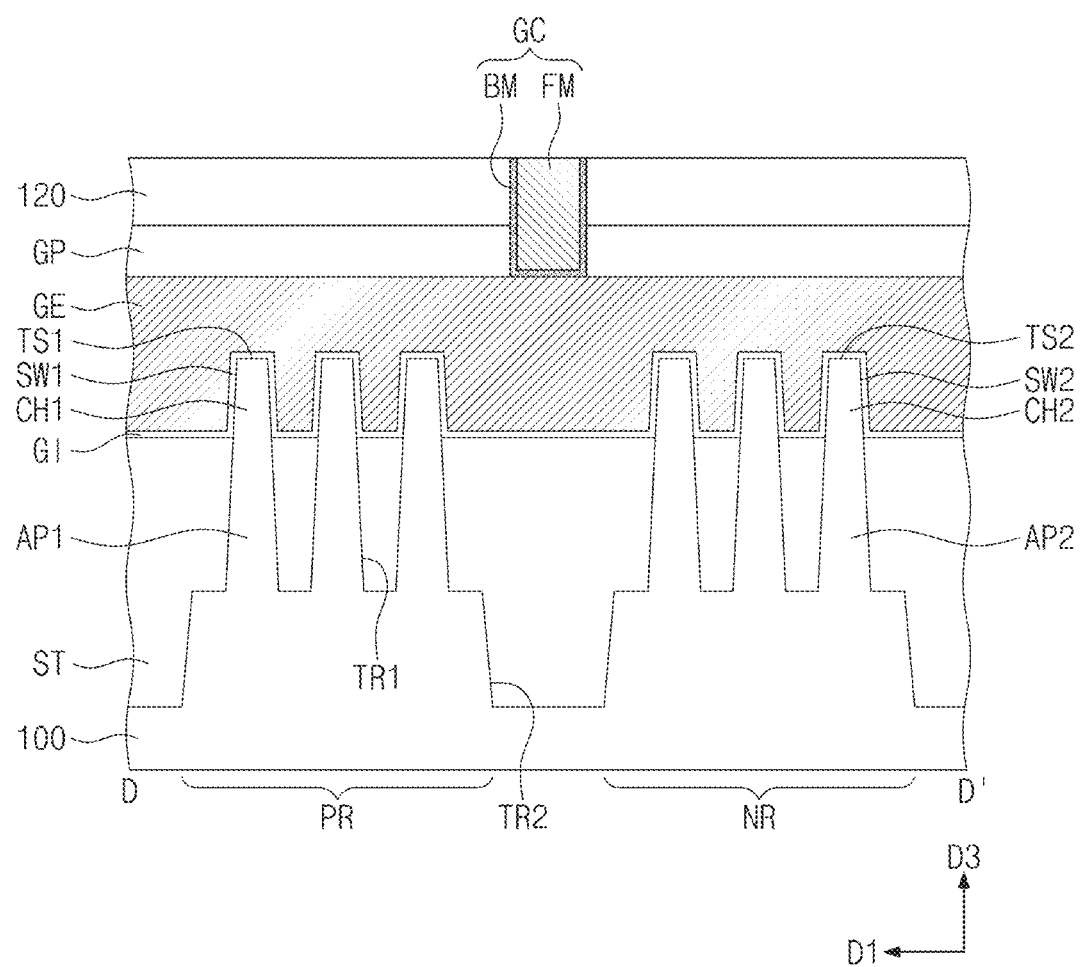

FIGS. 5, 7, 9, and 11 are plan views illustrating a method of fabricating a semiconductor device according to an example embodiment of the inventive concepts. FIGS. 6, 8A, 10A, and 12A are sectional views taken along lines A-A' of FIGS. 5, 7, 9, and 11, respectively. FIGS. 8B, 10B, and 12B are sectional views taken along lines B-B' of FIGS. 7, 9, and 11, respectively. FIGS. 10C and 12C are sectional views taken along lines C-C' of FIGS. 9 and 11, respectively. FIGS. 10D and 12D are sectional views taken along lines D-D' of FIGS. 9 and 11, respectively.

Figure 5:
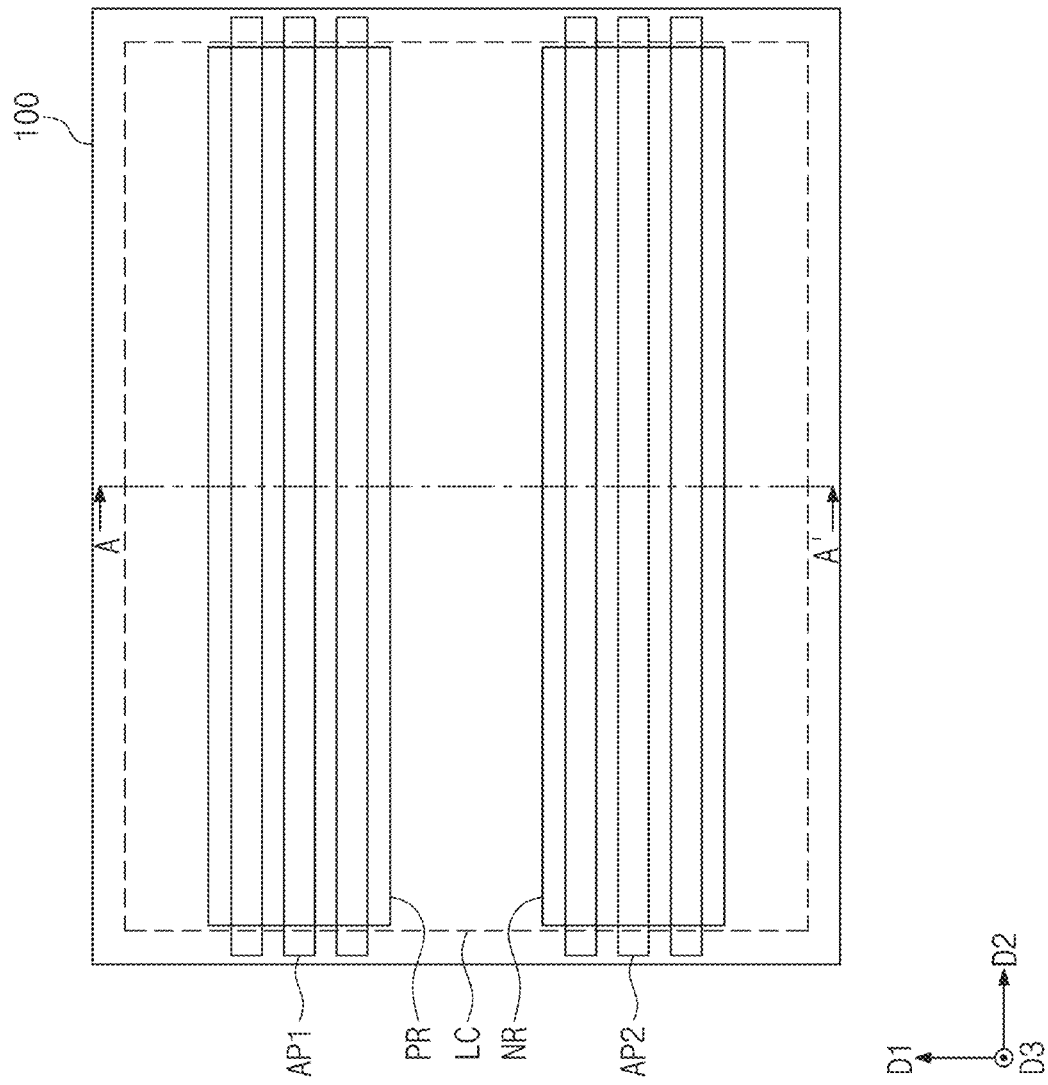
Figure 6:
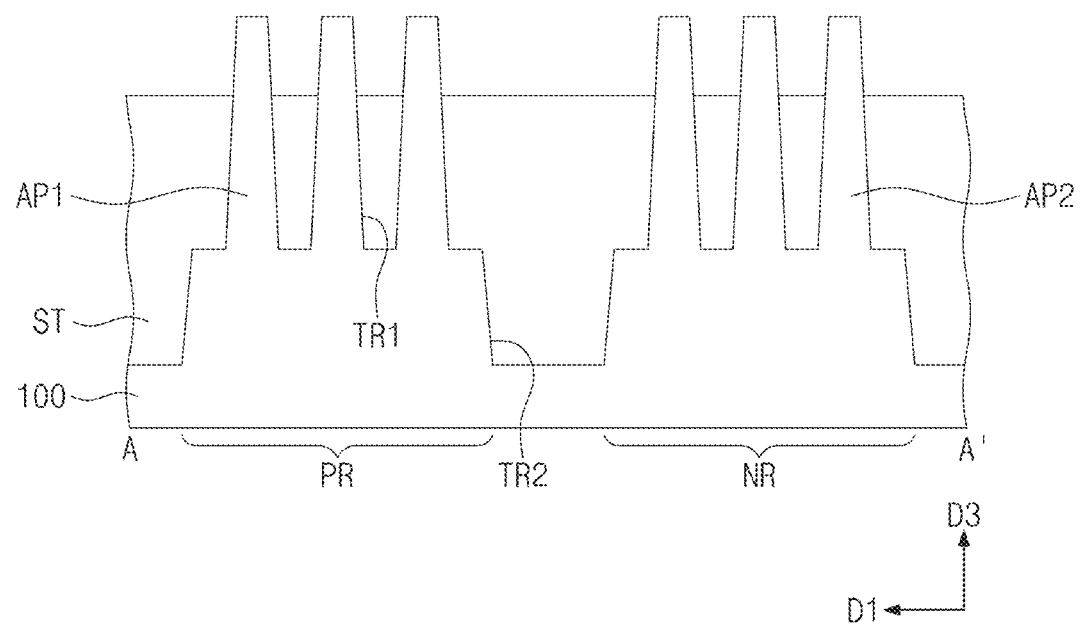
FIGS. 6, 8A, 10A, and 12A are sectional views taken along lines A-A' of FIGS. 5, 7, 9, and 11, respectively.

Referring to FIGS. 5 and 6, the substrate 100 including the first and second active regions PR and NR may be provided. The first and second active regions PR and NR may define the logic cell LC on the substrate 100.

The first and second active patterns AP1 and AP2 may be formed by patterning the substrate 100. The first active patterns AP1 may be formed on the first active region PR, and the second active patterns AP2 may be formed on the second active region NR. The first trench TR1 may be formed between the first active patterns AP1 and between the second active patterns AP2. The second trench TR2 may be formed by patterning a portion of the substrate 100 between the first and second active regions PR and NR. The second trench TR2 may be formed to have a depth that is larger than that of the first trench TR1.

The device isolation layer ST may be formed on the substrate 100 to fill the first and second trenches TR1 and TR2. The device isolation layer ST may be formed of or include an insulating material (e.g., silicon oxide). The device isolation layer ST may be recessed to expose upper portions of the first and second active patterns AP1 and AP2. For example, the upper portions of the first and second active patterns AP1 and AP2 may protrude vertically above the device isolation layer ST.

Figure 8A:
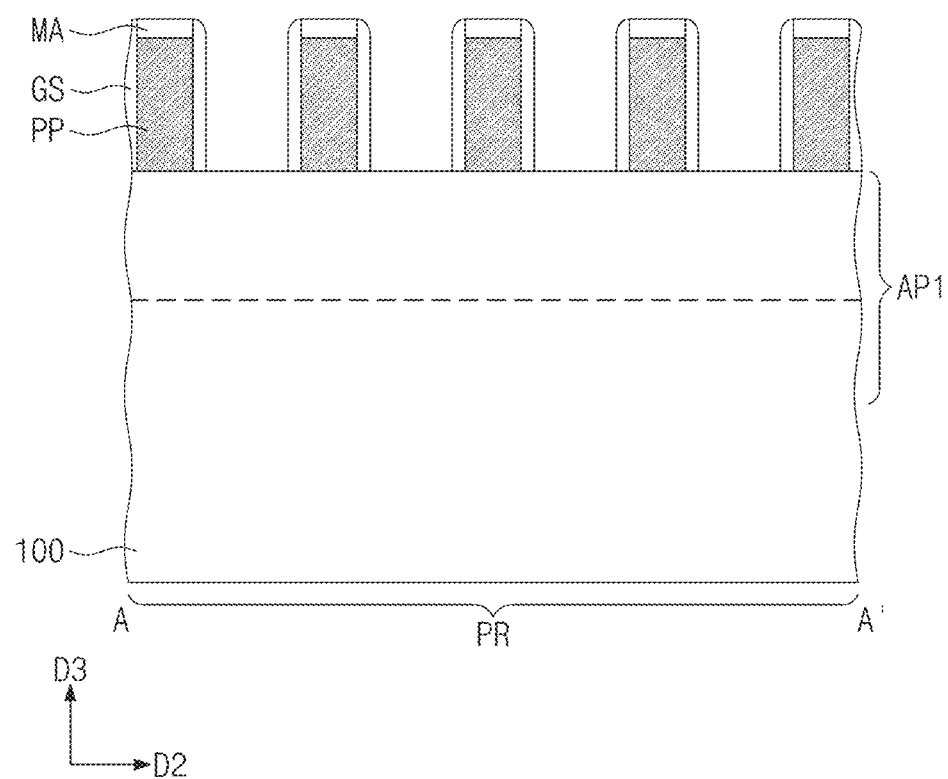
Figure 8B:
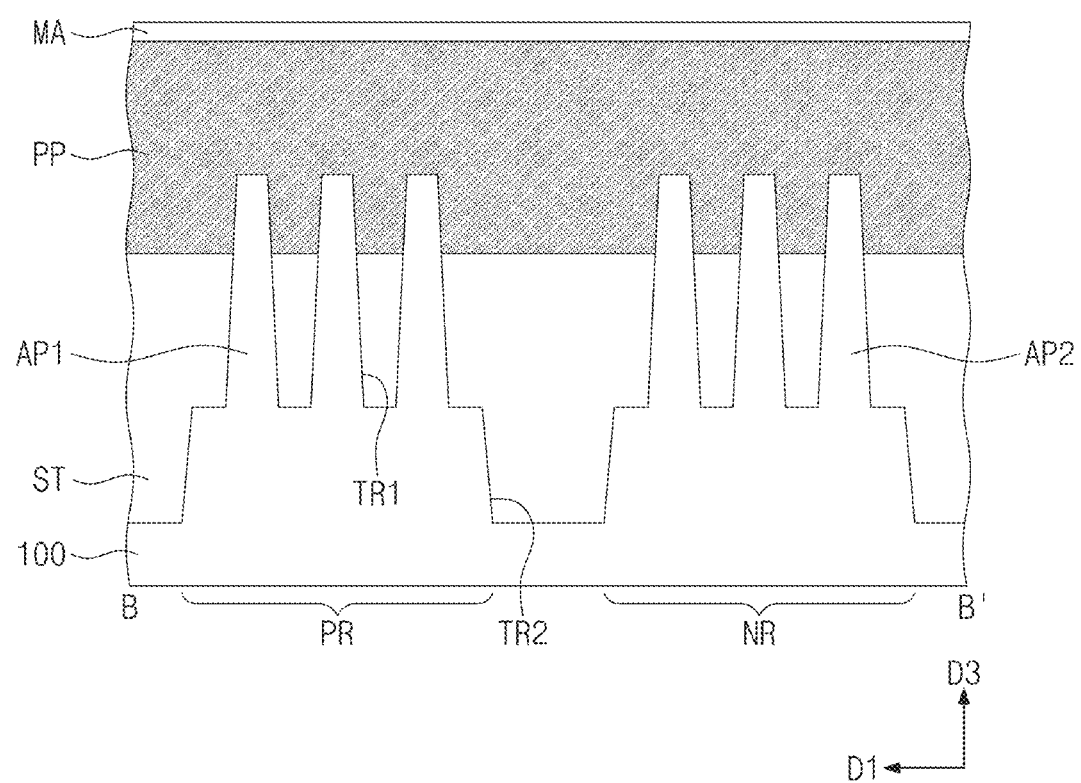
FIGS. 8B, 10B, and 12B are sectional views taken along lines B-B' of FIGS. 7, 9, and 11, respectively.
Figure 9:
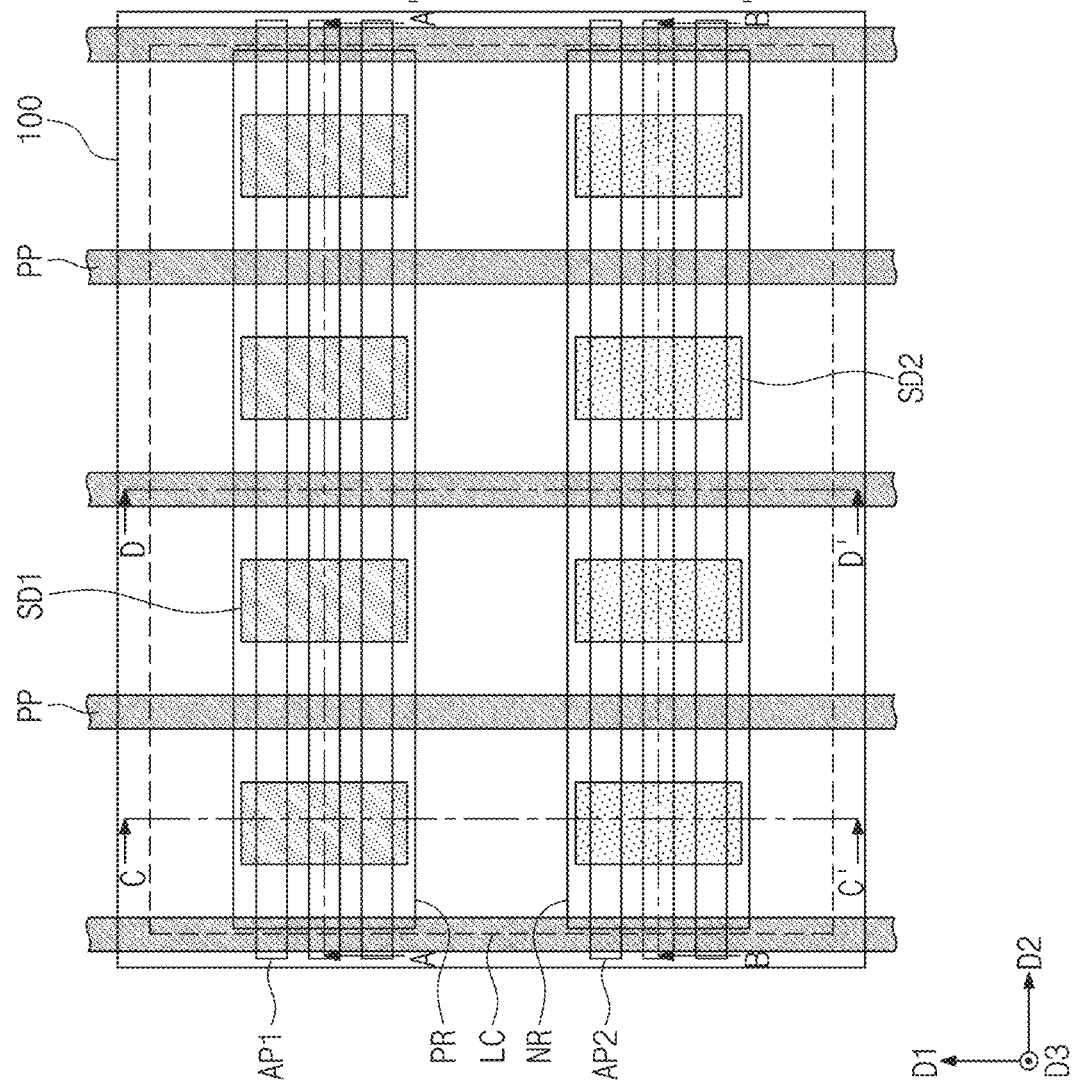

Referring to FIGS. 7, 8A, and 8B, sacrificial patterns PP may be formed to cross the first and second active patterns AP1 and AP2. The sacrificial patterns PP may be formed to have a line or bar shape extending in the first direction D1. As shown in FIG. 1, the sacrificial patterns PP may be formed to be spaced apart from each other with the first pitch P1 in the second direction D2.

For example, the formation of the sacrificial patterns PP may include forming a sacrificial layer on the substrate 100, forming hard mask patterns MA on the sacrificial layer, and patterning the sacrificial layer using the hard mask patterns MA as an etch mask. The sacrificial layer may be formed of or include poly silicon.

A pair of the gate spacers GS may be formed on both side surfaces of each of the sacrificial patterns PP. The formation of the gate spacers GS may include conformally forming a gate spacer layer on the substrate 100 and anisotropically etching the gate spacer layer. In an example embodiment, the gate spacer layer may be formed of or include at least one of SiCN, SiCON, or SiN. In certain example embodiments, the gate spacer layer may be a multi-layered structure including at least two of SiCN, SiCON, or SiN layers.

Referring to FIGS. 9 and 10A to 10D, the first source/drain patterns SD1 may be formed in an upper portion of the first active pattern AP1. A pair of the first source/drain patterns SD1 may be formed at both sides of each of the sacrificial patterns PP.

For example, first recesses RSR1 may be formed by etching the upper portion of the first active pattern AP1 using the hard mask patterns MA and the gate spacers GS as an etch mask. The device isolation layer ST between the first active patterns AP1 may be recessed during the etching of the upper portion of the first active pattern AP1 (e.g., see FIG. 10C).

The first source/drain pattern SD1 may be formed by performing a selective epitaxial growth process using an inner side surface of the first recess RSR1 of the first active pattern AP1 as a seed layer. As a result of the formation of the first source/drain patterns SD1, the first channel pattern CH1 may be defined between each pair of the first source/drain patterns SD1. In an example embodiment, the selective epitaxial growth process may include a chemical vapor deposition (CVD) process or a molecular beam epitaxy (MBE) process. The first source/drain patterns SD1 may include a semiconductor element (e.g., SiGe), whose lattice constant is larger than a lattice constant of a semiconductor element in the substrate 100. Each of the first source/drain patterns SD1 may be a multi-layered structure including a plurality of semiconductor layers.

In an example embodiment, the first source/drain patterns SD1 may be doped in situ during a selective epitaxial growth process. In certain example embodiments, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed on the second active pattern AP2. A pair of the second source/drain patterns SD2 may be formed at both sides of each of the sacrificial patterns PP.

For example, second recesses RSR2 may be formed by etching an upper portion of the second active pattern AP2 using the hard mask patterns MA and the gate spacers GS as an etch mask. The second source/drain pattern SD2 may be formed by performing a selective epitaxial growth process using an inner side surface of the second recess RSR2 of the second active pattern AP2 as a seed layer, may be performed to form. As a result of the formation of the second source/drain patterns SD2, the second channel pattern CH2 may be defined between each pair of the second source/drain patterns SD2. In an example embodiment, the second source/drain patterns SD2 may include the semiconductor element (e.g., Si) as the substrate 100. The second source/drain patterns SD2 may be doped to have a second conductivity type (e.g., n-type).

The first source/drain patterns SD1 and the second source/drain patterns SD2 may be sequentially formed through different processes. That is, the second source/drain patterns SD2 of the first source/drain patterns SD1 may not be formed at the same time.

Referring to FIGS. 11 and 12A to 12D, the first interlayered insulating layer 110 may be formed to cover the first and second source/drain patterns SD1 and SD2, the hard mask patterns MA, and the gate spacers GS. In an example embodiment, the first interlayered insulating layer 110 may be formed of or include silicon oxide.

The first interlayered insulating layer 110 may be planarized to expose the top surfaces of the sacrificial patterns PP. The planarization of the first interlayered insulating layer 110 may be performed using an etch-back or chemical mechanical polishing (CMP) process. In an example embodiment, the planarization process may be performed to fully remove the hard mask patterns MA. Accordingly, the first interlayered insulating layer 110 may have a top surface that is coplanar with the top surfaces of the sacrificial patterns PP and the top surfaces of the gate spacers GS.

The sacrificial patterns PP may be replaced with the gate electrodes GE, respectively. For example, the exposed sacrificial patterns PP may be selectively removed. As a result of the removal of the sacrificial patterns PP, empty spaces may be formed. The gate insulating layer GI, the gate electrode GE, and the gate capping pattern GP may be formed in each of the empty spaces. The gate electrode GE may include a first metal pattern and a second metal pattern on the first metal pattern. The first metal pattern may be formed of a work function metal capable of adjusting a threshold voltage of a transistor, and the second metal pattern may be formed of a metallic material whose resistance is low.

The second interlayered insulating layer 120 may be formed on the first interlayered insulating layer 110. The second interlayered insulating layer 120 may be formed of or include silicon oxide. The active contacts AC may be formed to penetrate the second interlayered insulating layer 120 and the first interlayered insulating layer 110 and to be electrically connected to the first and second source/drain patterns SD1 and SD2. The gate contact GC may be formed to penetrate the second interlayered insulating layer 120 and the gate capping pattern GP and to be electrically connected to the gate electrode GE.

A pair of the isolation structures DB may be formed along both sides of the logic cell LC, which are opposite to each other in the second direction D2. The isolation structures DB may overlap the gate electrodes GE, which are formed at the both sides of the logic cell LC. For example, the formation of the isolation structures DB may include forming a hole, which is extended into the first and second active patterns AP1 and AP2 through the first and second interlayered insulating layers 110 and 120 and the gate electrode GE, and then filling the hole with an insulating layer.

Referring back to FIGS. 1 and 2A to 2D, the third interlayered insulating layer 130 may be formed on the second interlayered insulating layer 120. The first metal layer M1 may be formed in the third interlayered insulating layer 130. The formation of the first metal layer M1 may include forming the first and second power lines PIL1 and PIL2, the first to fifth lower interconnection lines LIL1 to LIL5, and the lower vias VI.

The etch stop layer ESL may be formed on the first metal layer M1. The fourth interlayered insulating layer 140 may be formed on the etch stop layer ESL. The second metal layer M2 may be formed in the fourth interlayered insulating layer 140. The formation of the second metal layer M2 may include forming the first to fourth upper interconnection lines UIL1 to UIL4. In an example embodiment, the first to fourth upper interconnection lines UIL1 to UIL4 may be formed by a dual damascene process.

According to an example embodiment of the inventive concepts, a process for forming the interconnection lines PILL PIL2, and LIL1 to LIL5 of the first metal layer M1 or the interconnection lines UIL1 to UIL4 of the second metal layer M2 may include a lithography process performed using an extreme ultraviolet (EUV) light. In the present specification, the EUV light may have a wavelength ranging from 4 nm to 124 nm and, in particular, from 4 nm to 20 nm and may be, for example, an ultraviolet light having a wavelength of 13.5 nm. The EUV light may have an energy of 6.21 eV to 124 eV, and, in particular, from 90 eV to 95 eV.

The lithography process using the EUV light may include performing an exposing process of irradiating the EUV light onto a photoresist layer and performing a developing process. As an example, the photoresist layer may be an organic photoresist layer containing an organic polymer (e.g., polyhydroxystyrene). The organic photoresist layer may further include a photosensitive compound which can be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have a line shape extending in a specific direction, an island shape, a zigzag shape, a honeycomb shape, or a circular shape, but the inventive concepts are not limited to these examples.

Mask patterns may be formed by patterning at least one mask layer, which is disposed below the photoresist patterns, using the photoresist patterns as an etch mask. Thereafter, trenches, which will be filled with desired patterns (e.g., the interconnection lines), may be formed on a wafer by patterning the interlayer insulating layer 130 or 140, which is a target layer, using the mask patterns as an etch mask.

In a comparative example of the inventive concepts, a multi-patterning technology (MPT) using two or more photomasks is required to form fine-pitch patterns on the wafer. In contrast, in the case where the EUV lithography process according to an example embodiment of the inventive concepts is performed, the interconnection lines may be formed to have a fine pitch, using just one photomask.

For example, referring back to FIG. 2D, the second pitch P2 between the first and second lower interconnection lines LIL1 and LIL2, which are realized by the EUV lithography process according to the present example embodiment, may be less than or equal to 45 nm. That is, the EUV lithography process may be performed to precisely and finely form the interconnection lines, without a multi-patterning technology.

FIGS. 13 to 17 are enlarged sectional views, which illustrate the portion M of FIG. 2D to explain a method of forming an upper interconnection line according to an example embodiment of the inventive concepts. Hereinafter, a method of forming the second upper interconnection line UIL2 will be described in more detail with reference to FIGS. 13 to 17.

Figure 13:
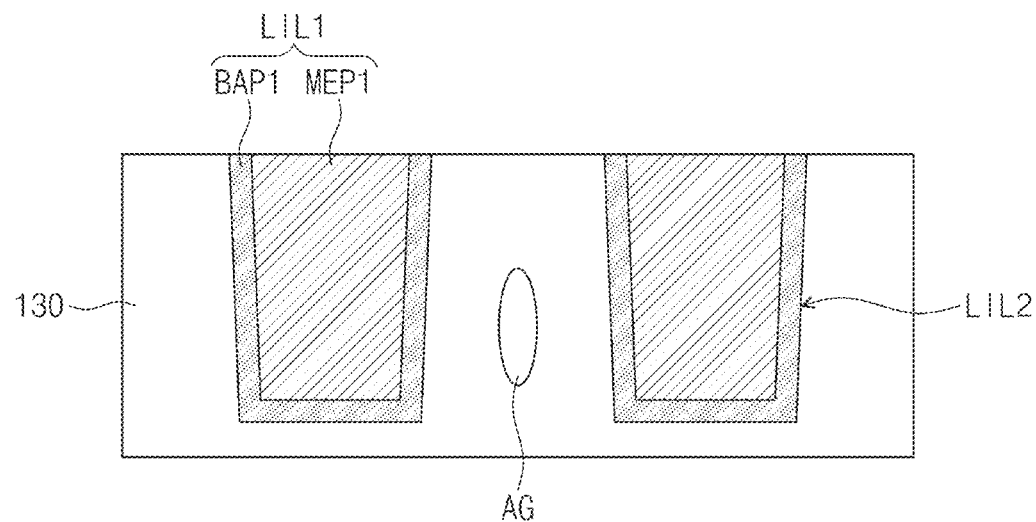
FIGS. 13 to 17 are enlarged sectional views, which illustrate the portion M of FIG. 2D to explain a method of forming an upper interconnection line according to an example embodiment of the inventive concepts.

Referring to FIG. 13, the first lower interconnection line LIL1 and the second lower interconnection line LIL2 may be formed in an upper portion of the third interlayer insulating layer 130. The first and second lower interconnection lines LIL1 and LIL2 may be adjacent to each other. In an example embodiment, the first and second lower interconnection lines LIL1 and LIL2 may be formed by a single damascene process. Each of the first and second lower interconnection lines LIL1 and LIL2 may be formed by sequentially forming a first barrier metal pattern BAP1 and a first metal pattern MEP1.

The air gap AG may be formed in the third interlayer insulating layer 130 between the first and second lower interconnection lines LIL1 and LIL2. For example, the formation of the air gap AG may include forming the first and second lower interconnection lines LIL1 and LIL2 in a preliminary interlayer insulating layer, removing the preliminary interlayer insulating layer, forming the third interlayer insulating layer 130 on the first and second lower interconnection lines LIL1 and LIL2 exposed, and planarizing the third interlayer insulating layer 130 to expose the top surfaces of the first and second lower interconnection lines LIL1 and LIL2. The air gap AG may be formed between the first and second lower interconnection lines LIL1 and LIL2, when the third interlayer insulating layer 130 is formed.

Figure 14:
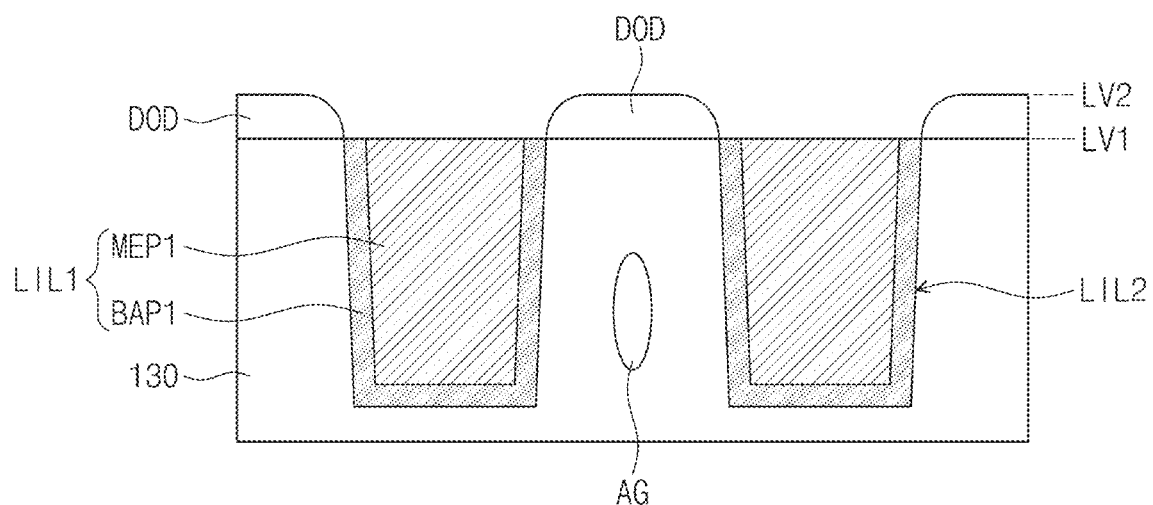

Referring to FIG. 14, the dielectric layer DOD may be selectively formed on the top surface of the third interlayer insulating layer 130. The dielectric layer DOD may not be formed on the top surfaces of the first and second lower interconnection lines LIL1 and LIL2.

For example, the formation of the dielectric layer DOD may include selectively providing an inhibitor on the top surfaces of the first and second lower interconnection lines LIL1 and LIL2 and depositing the dielectric layer DOD on the third interlayer insulating layer 130. The inhibitor may mitigate or prevent a precursor of the dielectric layer DOD from being attached on the top surfaces of the first and second lower interconnection lines LIL1 and LIL2.

The dielectric layer DOD may contain elements X and Y. Here, the element X is an element selected from the group consisting of Si, Ge, Al, Zr, Y, Hf, and Mo, and the element Y may be O or N. The dielectric layer DOD may further contain carbon (C).

Figure 15:
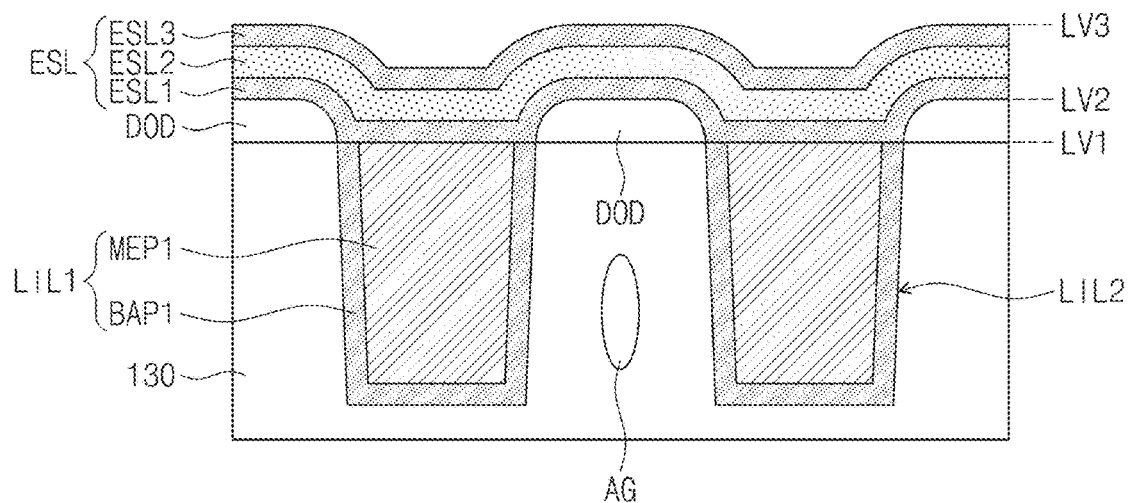

Referring to FIG. 15, the first etch stop layer ESL1 may be formed on the dielectric layer DOD and the first and second lower interconnection lines LIL1 and LIL2. The first etch stop layer ESL1 may cover the top surface of the dielectric layer DOD and the top surfaces of the first and second lower interconnection lines LIL1 and LIL2. The first etch stop layer ESL1 may be formed to a thickness of 2 nm to 5 nm. The first etch stop layer ESL1 may be formed of a material having a high dielectric constant and a low density. The first etch stop layer ESL1 may be a metal oxide layer which contains at least one metallic element selected from the group consisting of Al, Zr, Y, Hf, and Mo. The first etch stop layer ESL1 may have an etch selectivity with respect to the dielectric layer DOD.

The second etch stop layer ESL2 may be formed on the first etch stop layer ESL1. The second etch stop layer ESL2 may be formed to a thickness of 3 nm to 10 nm. The thickness of the second etch stop layer ESL2 may be larger than the thickness of the first etch stop layer ESL1. The second etch stop layer ESL2 may be formed of a material having a low dielectric constant and a high density. The second etch stop layer ESL2 may contain elements X and Y and carbon (C). Here, the element X is an element selected from the group consisting of Si, Ge, Al, Zr, Y, Hf, and Mo, and the element Y may be O or N.

The third etch stop layer ESL3 may be formed on the second etch stop layer ESL2. The second etch stop layer ESL2 may be formed to a thickness of 2 nm to 5 nm. The thickness of the second etch stop layer ESL2 may be larger than the thickness of the first etch stop layer ESL1. The third etch stop layer ESL3 may be a metal oxide layer which contains at least one metallic element selected from the group consisting of Al, Zr, Y, Hf, and Mo. For example, the third etch stop layer ESL3 may be formed of or include the same material as the first etch stop layer ESL1.

Figure 16:
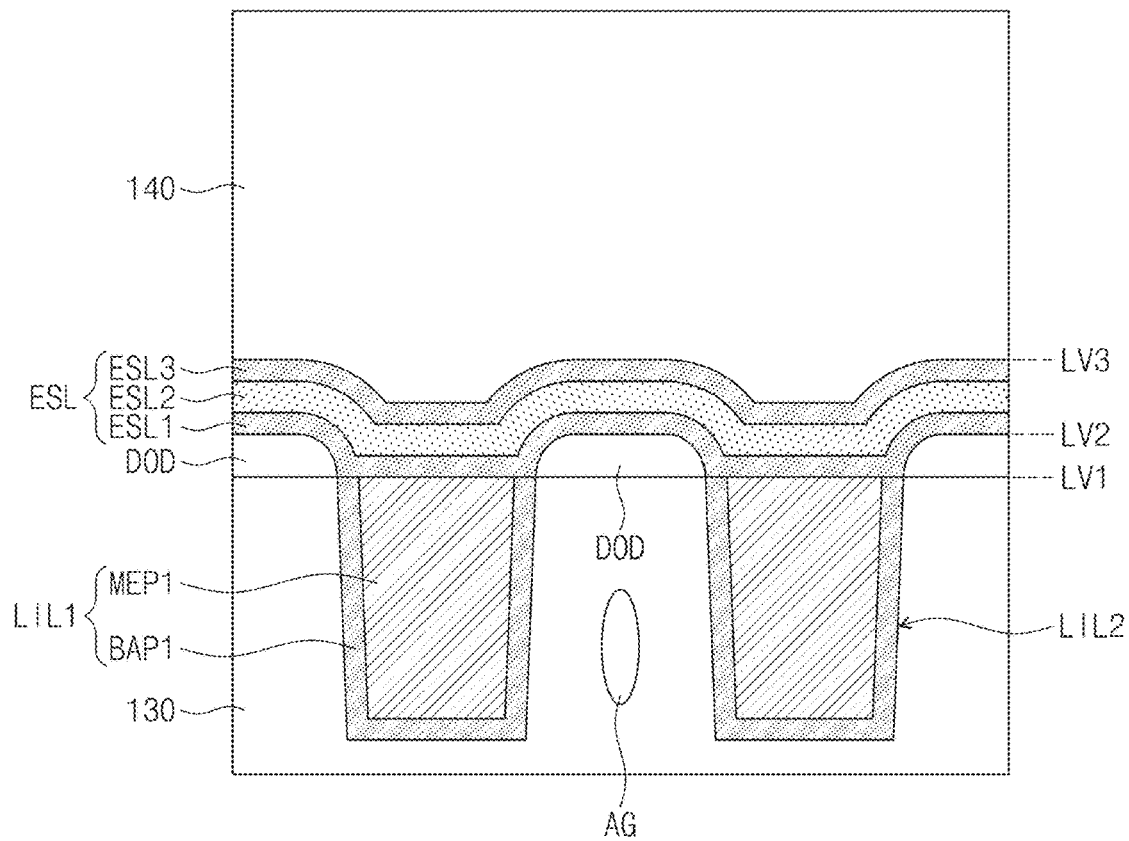

Referring to FIG. 16, the fourth interlayer insulating layer 140 may be formed on the third etch stop layer ESL3. For example, the fourth interlayer insulating layer 140 may include a silicon oxide layer containing silicon (Si) and oxygen (O). The fourth interlayer insulating layer 140 may further contain carbon (C) and hydrogen (H).

Figure 17:
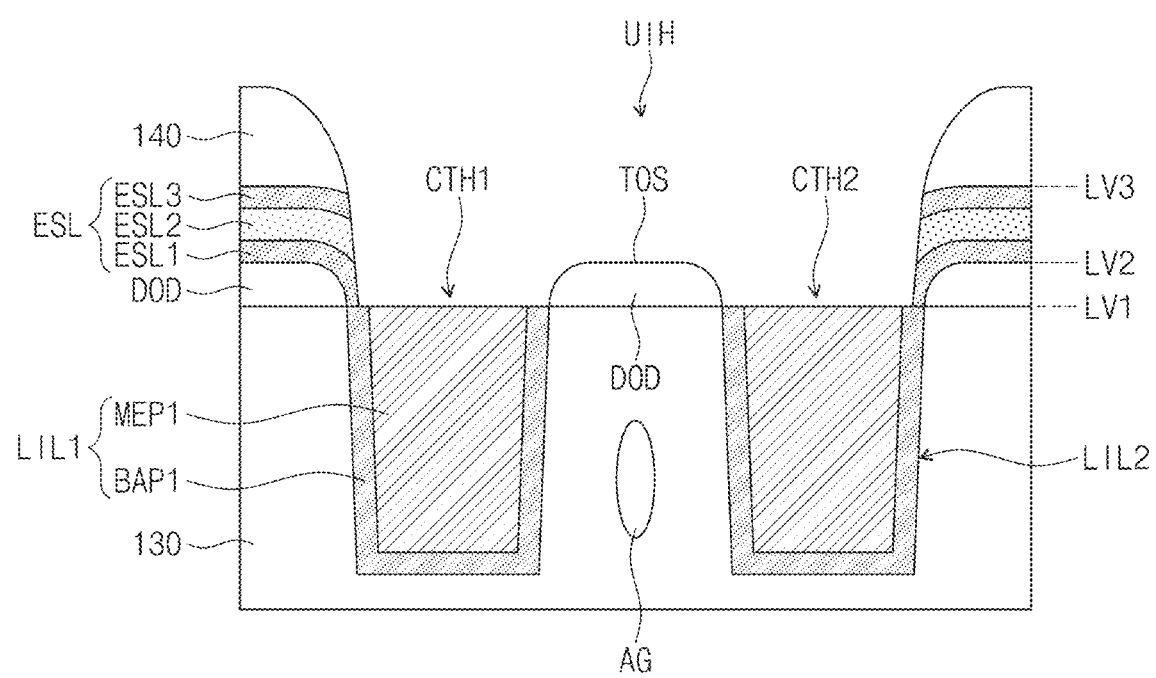

Referring to FIG. 17, an upper interconnection hole UIH may be formed by patterning an upper portion of the fourth interlayer insulating layer 140. The etch stop layer ESL may be patterned to form a first contact hole CTH1 and a second contact hole CTH2, which expose the top surfaces of the first and second lower interconnection lines LIL1 and LIL2, respectively.

Meanwhile, because the dielectric layer DOD has an etch selectivity with respect to the etch stop layer ESL, it may not be removed during the pattering of the etch stop layer ESL and may be left between the first and second lower interconnection lines LIL1 and LIL2. Thus, the first contact hole CTH1 and the second contact hole CTH2 may be spaced apart from each other with the dielectric layer DOD interposed therebetween. The top surface TOS of the dielectric layer DOD between the first and second lower interconnection lines LIL1 and LIL2 may be exposed through the upper interconnection hole UIH.

According to an example embodiment of the inventive concepts, the triple etch stop layer may make it possible to realize a high etch selectivity, during the etching process for forming the first and second contact holes CTH1 and CTH2, and thus, the first and second contact holes CTH1 and CTH2 may be formed to stably expose the top surfaces of the first and second lower interconnection lines LIL1 and LIL2. In addition, due to the high etch selectivity of the triple etch stop layer, the dielectric layer DOD may not be removed by the etching process and thus, it may be used to protect the third interlayer insulating layer 130 between the first and second lower interconnection lines LIL1 and LIL2. Accordingly, it may be possible to mitigate or prevent the third interlayer insulating layer 130 from being over-etched and thereby to prevent a process failure (e.g., exposure of the air gap AG) from occurring, when the first and second contact holes CTH1 and CTH2 are formed.

Referring back to FIG. 3, the second upper interconnection line UIL2 may be formed by filling the upper interconnection hole UIH with a conductive material. For example, the formation of the second upper interconnection line UIL2 may include forming a barrier layer (e.g., the second barrier metal pattern BAP2) in the upper interconnection hole UIH and forming a metal layer (e.g., the second metal pattern MEP2) on the barrier layer.

The second upper interconnection line UIL2 may include the bar via BVI filling both of the first and second contact holes CTH1 and CTH2. The bar via BVI may include the connecting portion CNP, which is provided on the dielectric layer DOD between the first and second lower interconnection lines LIL1 and LIL2.

Figure 18:
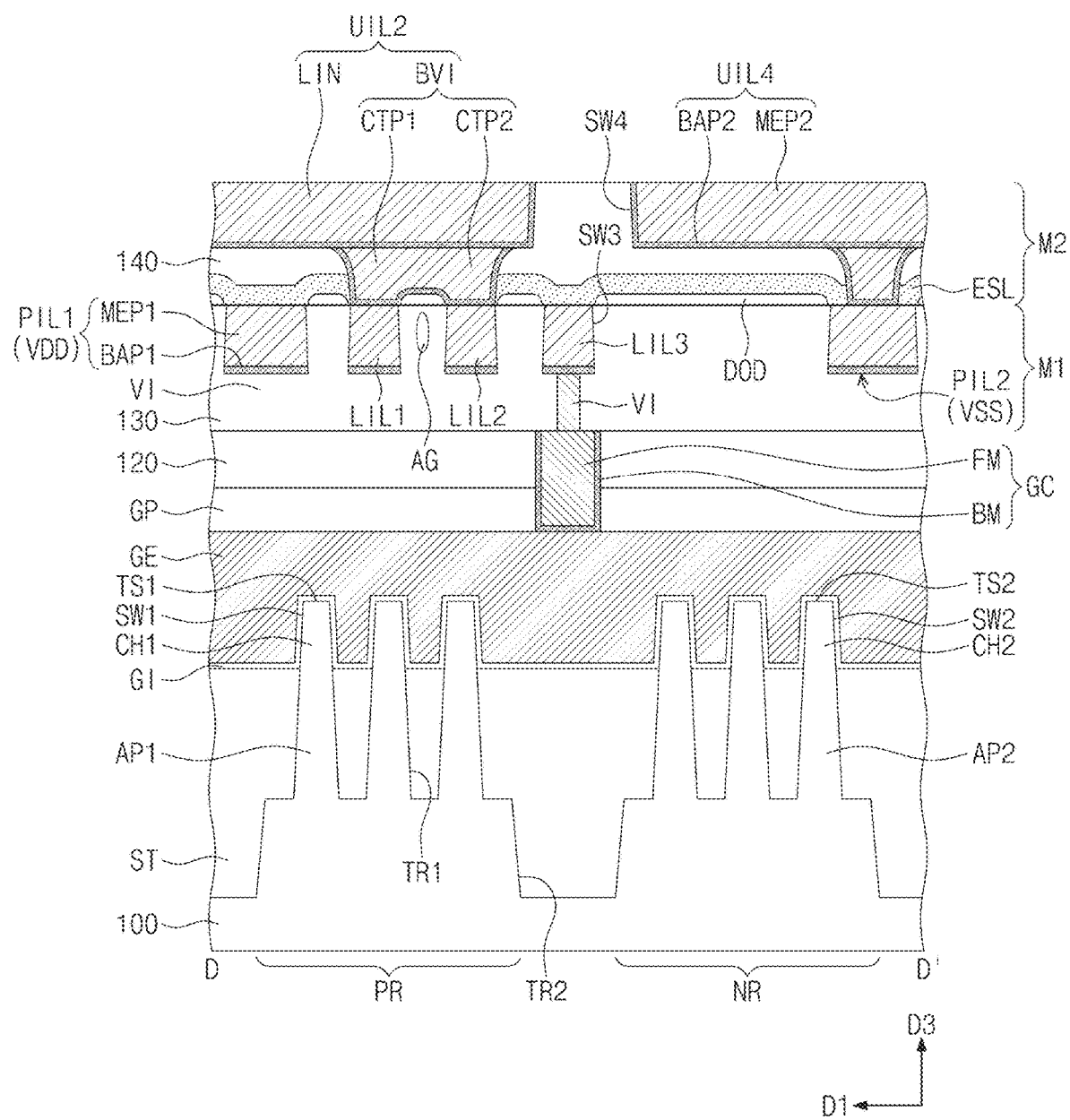
FIGS. 18 to 20 are sectional views, each of which is taken along the line D-D' of FIG. 1 to illustrate a semiconductor device according to another example embodiment of the inventive concepts.
Figure 19:
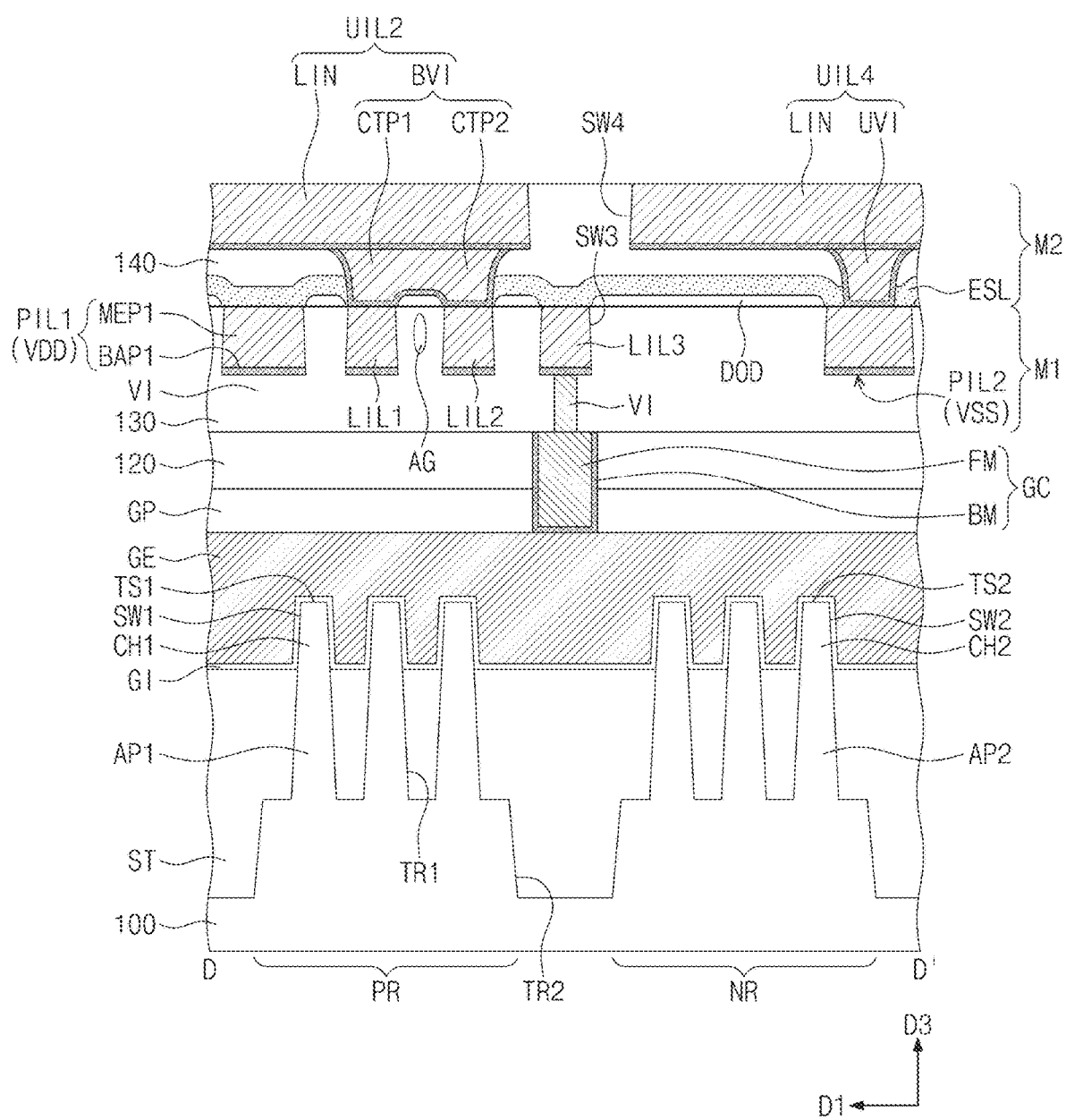
Figure 20:
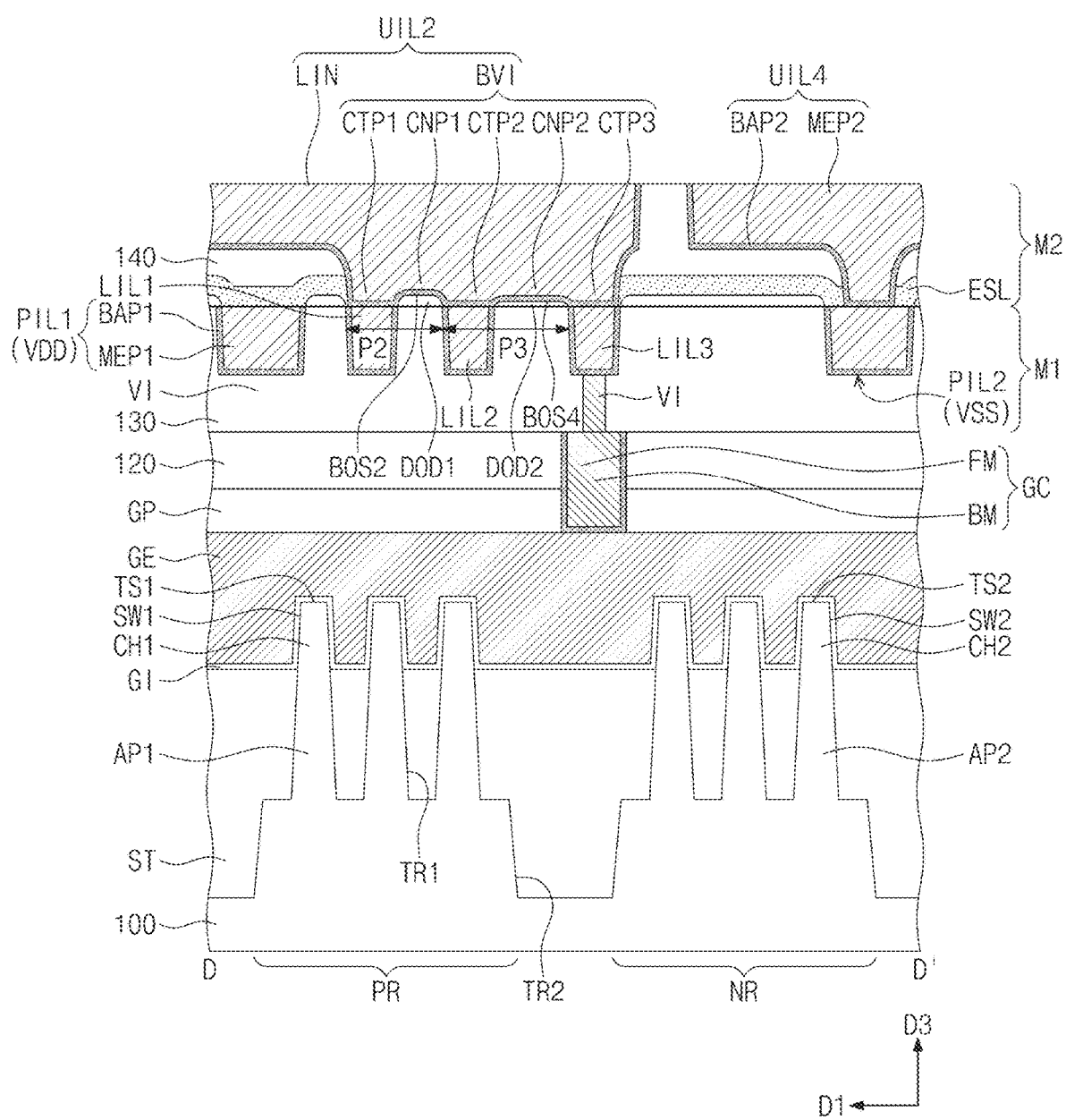

FIGS. 18 to 20 are sectional views, each of which is taken along the line D-D' of FIG. 1 to illustrate a semiconductor device according to another example embodiment of the inventive concepts. For concise description, an element previously described with reference to FIGS. 1, 2A to 2D, and 3 may be identified by the same reference number without repeating an overlapping description thereof.

Referring to FIG. 18, the interconnection lines PIL1 PIL2, and LIL1 to LIL5 in the first metal layer M1 may be formed by a subtractive process, not by the damascene process. For example, the third lower interconnection line LIL3 may include the first barrier metal pattern BAP1 and the first metal pattern MEP1. The first barrier metal pattern BAP1 may be provided as just a bottom portion of the third lower interconnection line LIL3. The first metal pattern MEP1 may be provided on the top surface of the first barrier metal pattern BAP1. The first barrier metal pattern BAP1 may cover only the bottom surface of the first metal pattern MEP1 and may not cover the side surfaces of the first metal pattern MEP1.

A side surface SW3 of the third lower interconnection line LIL3 may have a negative slope. That is, a line width of the third lower interconnection line LIL3 may gradually decrease as it goes up in the third direction D3. The air gap AG may be provided in the third interlayer insulating layer 130 between the first and second lower interconnection lines LIL1 and LIL2.

The interconnection lines PIL1 PIL2, and LIL1 to LIL5 in the first metal layer M1 may be formed by depositing and patterning a metal layer. Thus, the first metal pattern MEP1 may be formed of or include a metallic material which can be patterned by an etching process. For example, the first metal pattern MEP1 may be formed of or include ruthenium (Ru) and/or molybdenum (Mo).

The interconnection lines UIL1 to UIL4 in the second metal layer M2 may be formed through a single damascene process. For example, the second upper interconnection line UIL2 may include the line portion LIN and the bar via BVI thereunder. Each of the line portion LIN and the bar via BVI may include a metal pattern and a barrier metal pattern surrounding the metal pattern. For example, the second barrier metal pattern BAP2 may be provided as an interface layer between the line portion LIN and the bar via BVI.

A side surface SW4 of the fourth upper interconnection line UIL4 may have a positive slope. That is, a slope of the side surface SW4 of the fourth upper interconnection line UIL4 may have a sign that is opposite to a slope of the side surface SW3 of the third lower interconnection line LIL3. This is because the interconnection lines PIL1 PIL2, and LIL1 to LIL5 in the first metal layer M1 are formed by the subtractive process, whereas the interconnection lines UIL1 to UIL4 in the second metal layer M2 are formed by the damascene process.

Referring to FIG. 19, the vias BVI and VVI in the second metal layer M2 may be formed by a single damascene process, and the line portions LIN in the second metal layer M2 may be formed by a subtractive process. That is, the interconnection lines UIL1 to UIL4 in the second metal layer M2 may be formed by a semi-damascene process. The side surface SW4 of the line portion LIN of the fourth upper interconnection line UIL4 may have a negative slope. In other words, the slope of the side surface SW4 of the fourth upper interconnection line UIL4 may have the same sign as the slope of the side surface SW3 of the third lower interconnection line LIL3.

Referring to FIG. 20, the bar via BVI of the second upper interconnection line UIL2 may be connected to all of the first to third lower interconnection lines LIL1 to LIL3. For example, the bar via BVI of the second upper interconnection line UIL2 may include the first contact portion CTP1, the second contact portion CTP2, a third contact portion CTP3. The first to third contact portions CTP1 to CTP3 may be connected to the first to third lower interconnection lines LIL1 to LIL3, respectively.

The bar via BVI may further include a first connecting portion CNP1 between the first and second contact portions CTP1 and CTP2 and a second connecting portion CNP2 between the second and third contact portions CTP2 and CTP3. A first dielectric layer DOD1 may be interposed between the first and second contact portions CTP1 and CTP2. A second dielectric layer DOD2 may be interposed between the second and third contact portions CTP2 and CTP3. The bottom surface BOS2 of the first connecting portion CNP1 may be in direct contact with a top surface of the first dielectric layer DOD1, and a bottom surface BOS4 of the second connecting portion CNP2 may be in direct contact with a top surface of the second dielectric layer DOD2.

The first to third lower interconnection lines LIL1 to LIL3 may be arranged with at least two different pitches, in the first direction D1. For example, a pitch between the first and second lower interconnection lines LIL1 and LIL2 may be a second pitch P2, and a pitch between the second and third lower interconnection lines LIL2 and LIL3 may be a third pitch P3. The third pitch P3 may be larger than the second pitch P2.

Because the third pitch P3 is larger than the second pitch P2, a width of the second dielectric layer DOD2 may be larger than a width of the first dielectric layer DOD1. Because the third pitch P3 is larger than the second pitch P2, a width of the first connecting portion CNP1 may be larger than a width of the second connecting portion CNP2.

In an example embodiment, a level of the bottom surface BOS2 of the first connecting portion CNP1 may be different from a level of the bottom surface BOS4 of the second connecting portion CNP2. For example, the level of the bottom surface BOS2 of the first connecting portion CNP1 may be higher than the level of the bottom surface BOS4 of the second connecting portion CNP2. That is, the topmost surface of the first dielectric layer DOD1 may be higher than the topmost surface of the second dielectric layer DOD2. This is because the second and third pitches P2 and P3 are different from each other.

Figure 21:
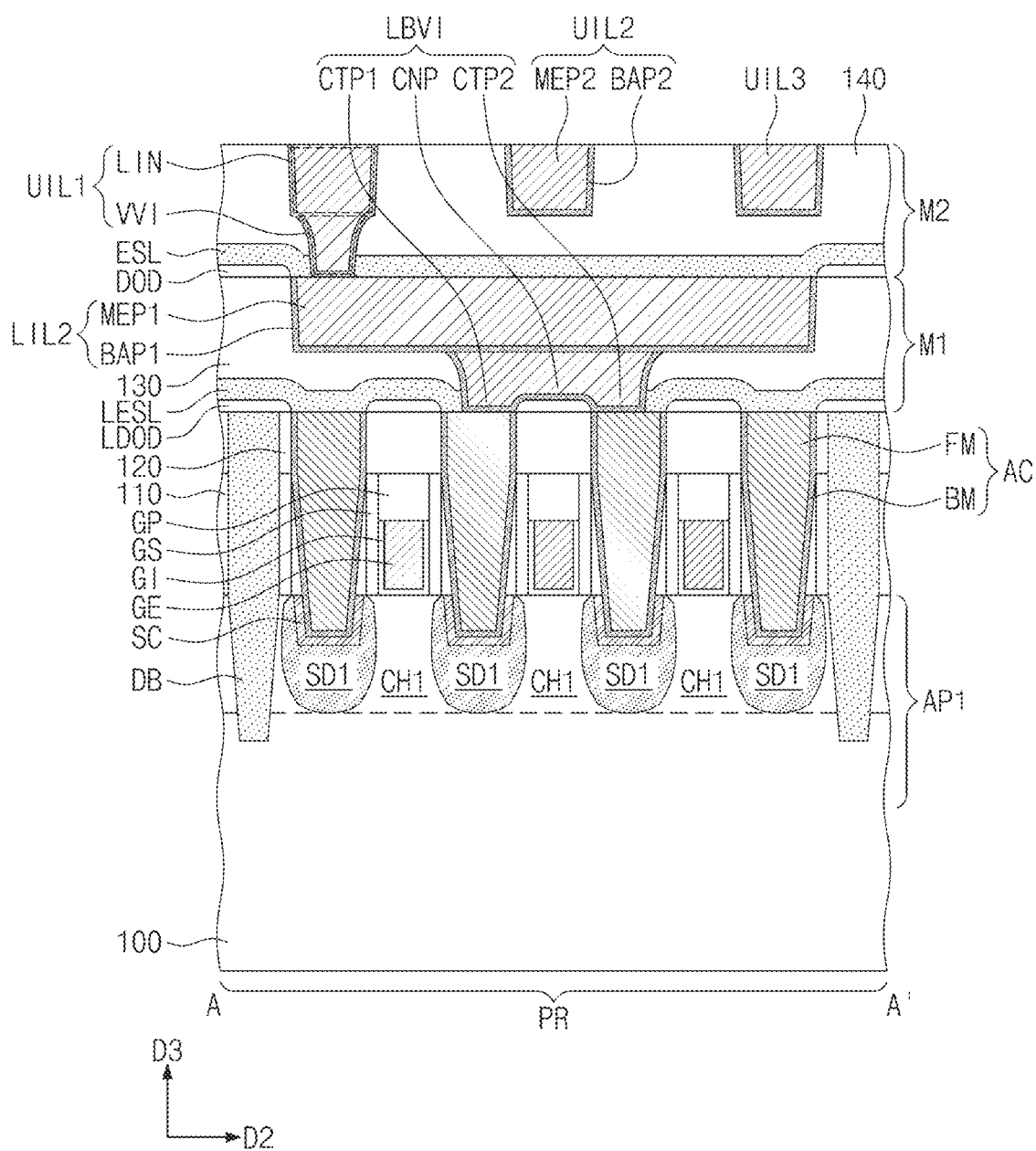
FIG. 21 is a sectional view, which is taken along the line A-A' of FIG. 1 to illustrate a semiconductor device according to another example embodiment of the inventive concepts.

FIG. 21 is a sectional view, which is taken along the line A-A' of FIG. 1 to illustrate a semiconductor device according to another example embodiment of the inventive concepts. For concise description, an element previously described with reference to FIGS. 1, 2A to 2D, and 3 may be identified by the same reference number without repeating an overlapping description thereof.

Referring to FIG. 21, a lower dielectric layer LDOD and a lower etch stop layer LESL may be interposed between the second interlayer insulating layer 120 and the third interlayer insulating layer 130. The lower dielectric layer LDOD may be in direct contact with the top surface of the second interlayer insulating layer 120. The lower dielectric layer LDOD may be selectively disposed on only the top surface of the second interlayer insulating layer 120 but not on the active contacts AC. The lower etch stop layer LESL may directly cover the dielectric layer DOD.

A lower bar via LBVI may be provided between the second lower interconnection line LIL2 and the active contacts AC. The lower bar via LBVI may include the first contact portion CTP1, the second contact portion CTP2, and the connecting portion CNP between the first and second contact portions CTP1 and CTP2.

The first and second contact portions CTP1 and CTP2 may be provided to penetrate the lower etch stop layer LESL and may be respectively coupled to an adjacent pair of the active contacts AC. The connecting portion CNP may be provided on the lower dielectric layer LDOD between the pair of the active contacts AC.

That is, the bar via according to the present example embodiment may be provided not only between the first and second metal layers M1 and M2 but also between the second interlayer insulating layer 120, in which the active and gate contacts AC and GC are provided, and the first metal layer M1.

FIGS. 22A to 22D are sectional views, which are respectively taken along the lines A-A', B-B', C-C', and D-D' of FIG. 1 to illustrate a semiconductor device according to an example embodiment of the inventive concepts. For concise description, an element previously described with reference to FIGS. 1 and 2A to 2D may be identified by the same reference number without repeating an overlapping description thereof.

Referring to FIGS. 1 and 22A to 22D, the substrate 100 including the first and second active regions PR and NR may be provided. The device isolation layer ST may be provided on the substrate 100. The device isolation layer ST may define the first and second active patterns AP1 and AP2 in an upper portion of the substrate 100. The first and second active patterns AP1 and AP2 may be defined on the first and second active regions PR and NR, respectively.

The first active pattern AP1 may include the first channel patterns CH1, which are vertically stacked on the substrate 100. The stacked first channel patterns CH1 may be spaced apart from each other in the third direction D3. The stacked first channel patterns CH1 may overlap each other, when viewed in a plan view. The second active pattern AP2 may include the second channel patterns CH2, which are vertically stacked on the substrate 100. The stacked second channel patterns CH2 may be spaced apart from each other in the third direction D3. The stacked second channel patterns CH2 may overlap each other, when viewed in a plan view. The first and second channel patterns CH1 and CH2 may be formed of or include at least one of silicon (Si), germanium (Ge), or silicon germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect each adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect each adjacent pair of the second source/drain patterns SD2 to each other.

The gate electrodes GE may be provided to extend in the first direction D1 and to cross the first and second channel patterns CH1 and CH2. The gate electrode GE may overlap the first and second channel patterns CH1 and CH2, when viewed in a plan view. A pair of the gate spacers GS may be disposed on both side surfaces of the gate electrode GE. The gate capping pattern GP may be provided on the gate electrode GE.

Figure 22A:
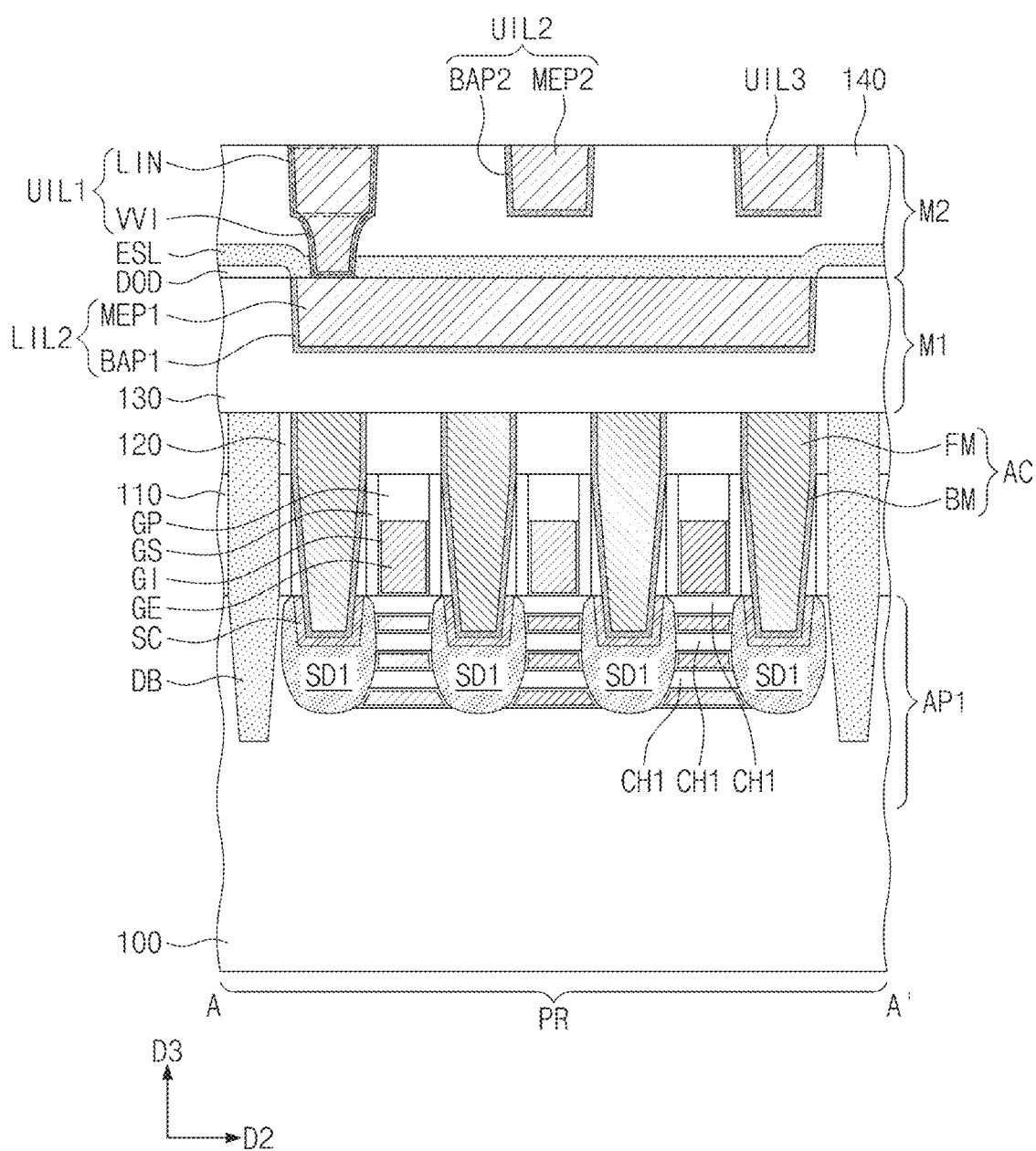
FIGS. 22A to 22D are sectional views, which are respectively taken along the lines A-A', B-B', C-C', and D-D' of FIG. 1 to illustrate a semiconductor device according to an example embodiment of the inventive concepts.
Figure 22B:
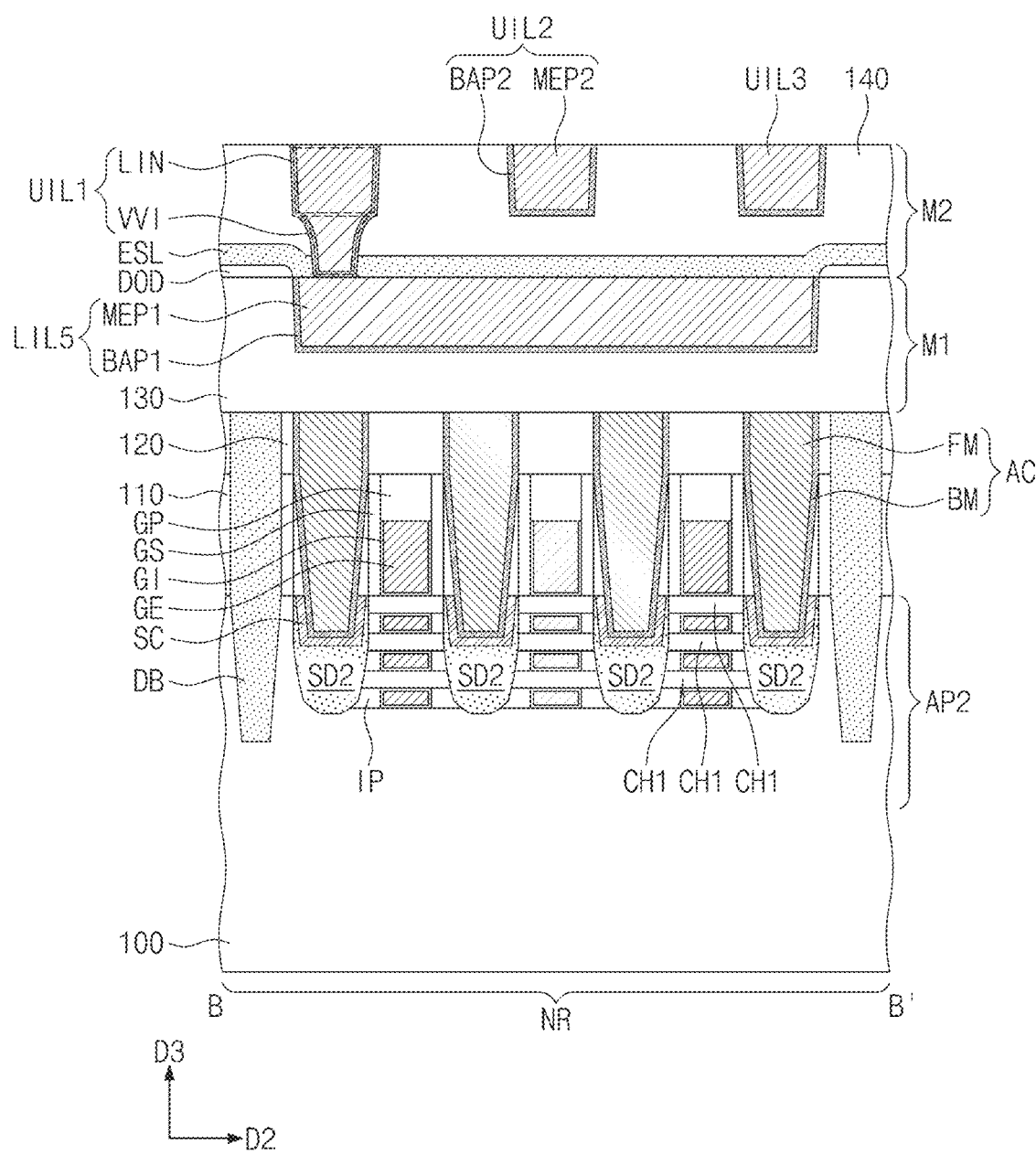
Figure 22C:
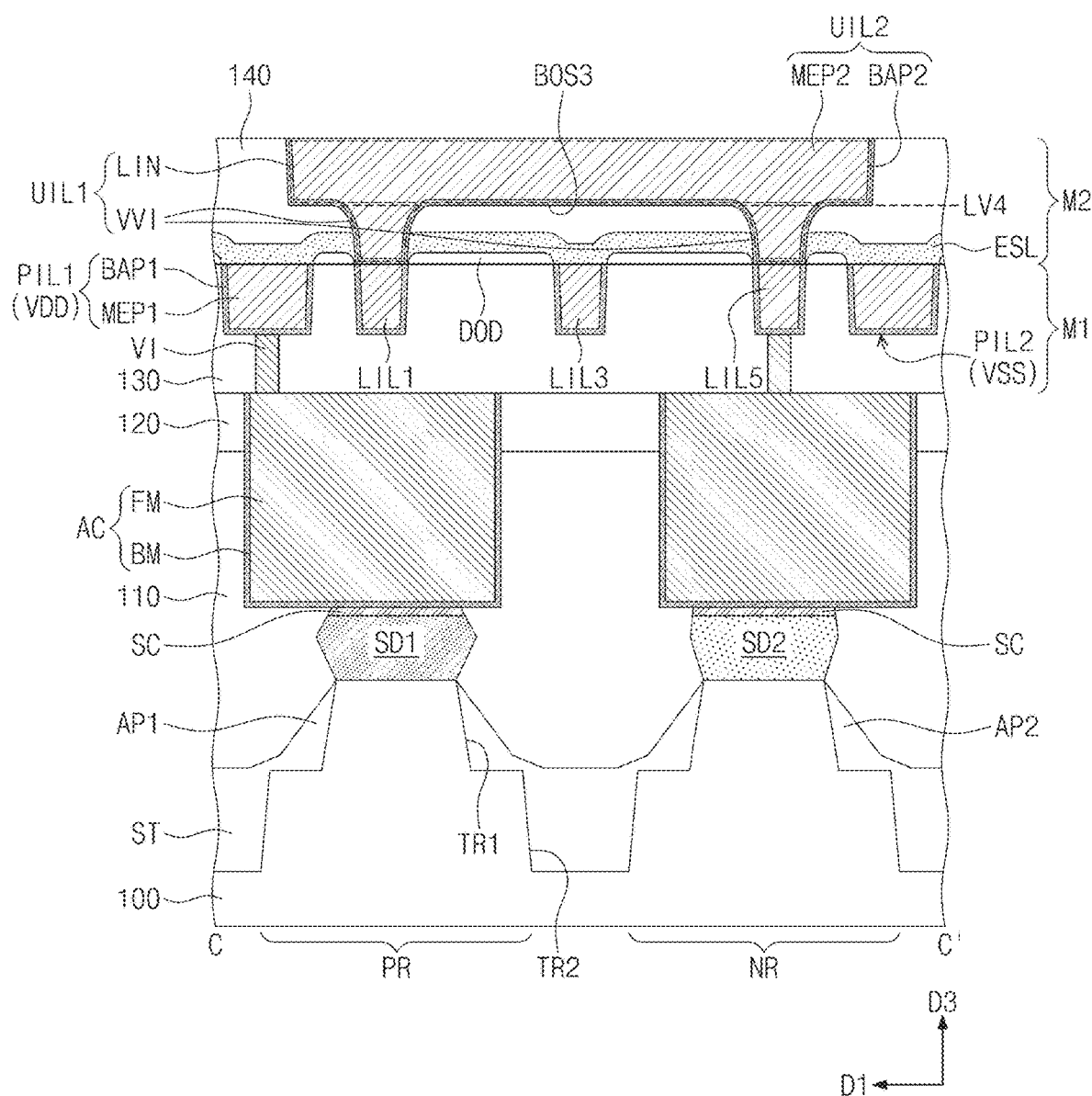
Figure 22D:
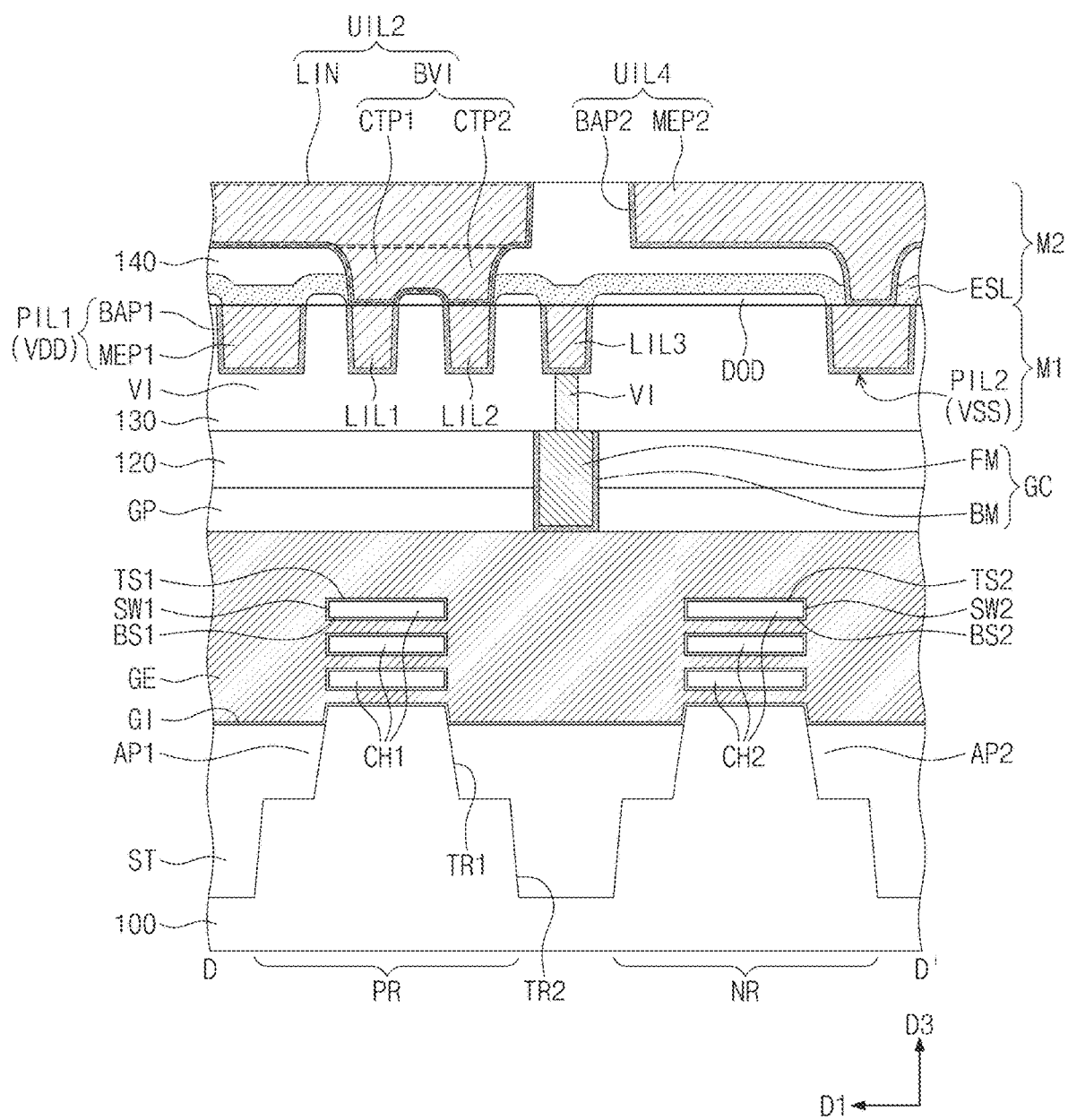

The gate electrode GE may be provided to surround each of the first and second channel patterns CH1 and CH2 (e.g., see FIG. 22D). The gate electrode GE may be provided on a first top surface TS1, at least one first side surface SW1, and a first bottom surface BS1 of the first channel pattern CH1. The gate electrode GE may be provided on a second top surface TS2, at least one second side surface SW2, and a second bottom surface BS2 of the second channel pattern CH2. That is, the gate electrode GE may surround a top surface, a bottom surface and both side surfaces of each of the first and second channel patterns CH1 and CH2. The transistor according to the present example embodiment may be a three-dimensional field effect transistor (e.g., a multi-bridge channel field-effect transistor (MBCFET)), in which the gate electrode GE is disposed to three-dimensionally surround the channel patterns CH1 and CH2.

The gate insulating layer GI may be provided between each of the first and second channel patterns CH1 and CH2 and the gate electrode GE. The gate insulating layer GI may surround each of the first and second channel patterns CH1 and CH2.

On the second active region NR, an insulating pattern IP may be interposed between the gate insulating layer GI and the second source/drain pattern SD2. The gate electrode GE may be spaced apart from the second source/drain pattern SD2 by the gate insulating layer GI and the insulating pattern IP. In contrast, on the first active region PR, the insulating pattern IP may be omitted.

The first interlayered insulating layer 110 and the second interlayered insulating layer 120 may be provided to cover the substrate 100. The active contacts AC may be provided to penetrate the first and second interlayered insulating layers 110 and 120 and may be connected to the first and second source/drain patterns SD1 and SD2, respectively. The gate contact GC may be provided to penetrate the second interlayered insulating layer 120 and the gate capping pattern GP and may be connected to the gate electrode GE.

The third interlayered insulating layer 130 may be provided on the second interlayered insulating layer 120. The fourth interlayered insulating layer 140 may be provided on the third interlayered insulating layer 130. The first metal layer M1 may be provided in the third interlayered insulating layer 130. The second metal layer M2 may be provided in the fourth interlayered insulating layer 140. The first metal layer M1 and the second metal layer M2 may be substantially the same as those in the previous example embodiment described with reference to FIGS. 1 and 2A to 2D.

According to an example embodiment of the inventive concepts, a semiconductor device may include an upper interconnection line with a bar-shaped via (hereinafter, a bar via) and lower interconnection lines, which are adjacent to each other with a very small pitch, connected in common to the upper interconnection line through the bar via. As a result, it may be possible to increase a degree of freedom in constructing a routing structure through a BEOL process.

Further, according to an example embodiment of the inventive concepts, it may be possible to mitigate or prevent a protruding portion from being extended downward from the bar via to a region between the lower interconnection lines. Accordingly, it may be possible to mitigate or prevent a process failure from occurring between the lower interconnection lines and to improve reliability and electrical characteristics of the semiconductor device.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   transistors on a substrate;
   a first interlayer insulating layer on the transistors;
   a first lower interconnection line and a second lower interconnection line in an upper portion of the first interlayer insulating layer;
   a dielectric layer being selectively on a top surface of the first interlayer insulating layer except top surfaces of the first and second lower interconnection lines;

an etch stop layer on the first and second lower interconnection lines and the dielectric layer;
a second interlayer insulating layer on the etch stop layer; and
an upper interconnection line in the second interlayer insulating layer,
wherein the upper interconnection line includes,
a line portion, and
a bar via extending from the line portion to the first and second lower interconnection lines to penetrate the etch stop layer, the bar via including,
a first contact portion and a second contact portion connected to the first and second lower interconnection lines, respectively, and
a first connecting portion between the first and second contact portions, a bottom surface of the first connecting portion being higher than the top surface of the first interlayer insulating layer and being lower than a top surface of the etch stop layer due to the dielectric layer.

2. The semiconductor device of claim 1, wherein the bottom surface of the first connecting portion is in contact with a top surface of the dielectric layer between the first and second contact portions.

3. The semiconductor device of claim 2, wherein a thickness of the dielectric layer between the first and second contact portions increases until the thickness reaches a maximum value and then decreases, along a direction from the first contact portion to the second contact portion.

4. The semiconductor device of claim 1, wherein
the first and second lower interconnection lines are arranged with a first pitch in a first direction, and
a width of the bar via in the first direction is larger than the first pitch.

5. The semiconductor device of claim 1, wherein a bottom surface of the line portion is higher than the top surface of the etch stop layer.

6. The semiconductor device of claim 1, wherein the etch stop layer comprises a material having an etch selectivity with respect to the dielectric layer.

7. The semiconductor device of claim 6, wherein
the etch stop layer includes a first etch stop layer, a second etch stop layer, and a third etch stop layer that are sequentially stacked,
a thickness of the second etch stop layer is larger than a thickness of the first etch stop layer, and
the thickness of the second etch stop layer is larger than a thickness of the third etch stop layer.

8. The semiconductor device of claim 1, further comprising:
a third lower interconnection line in the upper portion of the first interlayer insulating layer,
wherein the bar via further includes,
a third contact portion connected to the third lower interconnection line, and
a second connecting portion between the second and third contact portions, and
a level of the bottom surface of the first connecting portion is different from a level of a bottom surface of the second connecting portion.

9. The semiconductor device of claim 8, wherein
the dielectric layer comprises a first dielectric layer below the first connecting portion and a second dielectric layer below the second connecting portion, and
a level of the topmost surface of the first dielectric layer is different from a level of the topmost surface of the second dielectric layer.

10. The semiconductor device of claim 8, wherein a pitch between the first and second lower interconnection lines is different from a pitch between the second and third lower interconnection lines.

11. A semiconductor device, comprising:
transistors on a substrate;
a first interlayer insulating layer on the transistors;
a first lower interconnection line and a second lower interconnection line in an upper portion of the first interlayer insulating layer;
a dielectric layer being selectively on a top surface of the first interlayer insulating layer except top surfaces of the first and second lower interconnection lines;
an etch stop layer on the first and second lower interconnection lines and the dielectric layer;
a second interlayer insulating layer on the etch stop layer; and
a first upper interconnection line in the second interlayer insulating layer,
wherein the first upper interconnection line includes,
a first line portion; and
a bar via extending from the first line portion to the first and second lower interconnection lines to penetrate the etch stop layer, the bar via including,
a first contact portion and a second contact portion connected to the first and second lower interconnection lines, respectively, and
a first connecting portion between the first and second contact portions,
a top surface of the dielectric layer between the first and second contact portions is covered with the first connecting portion, and
a thickness of the dielectric layer between the first and second contact portions increases until the thickness reaches a maximum value and then decreases, along a direction from the first contact portion to the second contact portion.

12. The semiconductor device of claim 11, wherein the top surface of the dielectric layer below the first line portion is covered with the etch stop layer.

13. The semiconductor device of claim 11, further comprising:
a third lower interconnection line and a fourth lower interconnection line in the upper portion of the first interlayer insulating layer; and
a second upper interconnection line in the second interlayer insulating layer,
wherein the second upper interconnection line includes,
a first upper via and a second upper via connected to the third and fourth lower interconnection lines, respectively, and
a second line portion between the first and second upper vias, and
a bottom surface of the second line portion is higher than a bottom surface of the first connecting portion.

14. The semiconductor device of claim 11, further comprising:
a third lower interconnection line in the upper portion of the first interlayer insulating layer,
wherein the bar via includes,
a third contact portion connected to the third lower interconnection line, and
a second connecting portion between the second and third contact portions, and
a level of a bottom surface of the first connecting portion is different from a level of a bottom surface of the second connecting portion.

15. The semiconductor device of claim 14, wherein a pitch between the first and second lower interconnection lines is different from a pitch between the second and third lower interconnection lines.

16. A semiconductor device, comprising:
a substrate including an active region;
a device isolation layer defining active patterns on the active region, the device isolation layer covering a lower side surface of each of the active patterns, an upper portion of each of the active patterns protruding above the device isolation layer;
a pair of source/drain patterns at the upper portion of each of the active patterns;
a channel pattern between the pair of source/drain patterns;
a gate electrode extending in a first direction to cross the channel pattern;
a gate spacer on opposite side surfaces of the gate electrode and extending along the gate electrode in the first direction;
a gate insulating layer between the gate electrode and the channel pattern and between the gate electrode and the gate spacer;
a gate capping pattern on a top surface of the gate electrode and extending along the gate electrode and in the first direction;
a first interlayer insulating layer on the gate capping pattern;
an active contact penetrating the first interlayer insulating layer and electrically connected to at least one of the source/drain patterns;
a first metal layer in a second interlayer insulating layer, the second interlayer insulating layer being on the first interlayer insulating layer;
a second metal layer in a third interlayer insulating layer, the third interlayer insulating layer being on the second interlayer insulating layer; and
a dielectric layer and an etch stop layer between the second interlayer insulating layer and the third interlayer insulating layer,
wherein the etch stop layer covers the dielectric layer,
the first metal layer comprises a first lower interconnection line and a second lower interconnection line,
the second metal layer comprises a first upper interconnection line electrically connected to the first and second lower interconnection lines, and
the first upper interconnection line includes,
a first line portion, and
a bar via extending from the first line portion to the first and second lower interconnection lines to penetrate the etch stop layer, the bar via including,
a first contact portion and a second contact portion connected to the first and second lower interconnection lines, respectively, and
a first connecting portion between the first and second contact portions, a bottom surface of the first connecting portion being higher than a top surface of the second interlayer insulating layer and being lower than a top surface of the etch stop layer due to the dielectric layer.

17. The semiconductor device of claim 16, wherein the bottom surface of the first connecting portion is in contact with a top surface of the dielectric layer between the first and second contact portions.

18. The semiconductor device of claim 17, wherein a thickness of the dielectric layer between the first and second contact portions increases until the thickness reaches a maximum value and then decreases, along a direction from the first contact portion to the second contact portion.

19. The semiconductor device of claim 16, wherein
the first metal layer further comprises a third lower interconnection line and a fourth lower interconnection line,
the second metal layer comprises a second upper interconnection line electrically connected to the third and fourth lower interconnection lines,
the second upper interconnection line includes,
a first upper via and a second upper via connected to the third and fourth lower interconnection lines, respectively, and
a second line portion between the first and second upper vias, and
a bottom surface of the second line portion is higher than the bottom surface of the first connecting portion.

20. The semiconductor device of claim 16, wherein
the etch stop layer comprises a first etch stop layer, a second etch stop layer, and a third etch stop layer that are sequentially stacked,
each of the first and third etch stop layers comprises a metal oxide layer or a metal nitride layer containing at least one metallic element selected from the group consisting of Al, Zr, Y, Hf, and Mo, and
the second etch stop layer contains elements X and Y and carbon (C), where the element X is selected from the group consisting of Si, Ge, Al, Zr, Y, Hf, and Mo, and the element Y is O or N.

* * * * *